(12) United States Patent
Hansen

(10) Patent No.: US 7,528,934 B2
(45) Date of Patent: *May 5, 2009

(54) LITHOGRAPHIC APPARATUS AND DEVICE MANUFACTURING METHOD

(75) Inventor: Steven George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 441 days.

This patent is subject to a terminal disclaimer.

(21) Appl. No.: 11/236,870

(22) Filed: Sep. 28, 2005

(65) Prior Publication Data

US 2007/0242251 A1    Oct. 18, 2007

Related U.S. Application Data

(63) Continuation-in-part of application No. 11/129,556, filed on May 16, 2005.

(51) Int. Cl.
*G03B 27/52* (2006.01)
*G03B 27/42* (2006.01)

(52) U.S. Cl. .......................................... 355/55; 355/53

(58) Field of Classification Search ................... 355/55, 355/53, 67; 430/5; 716/19; 700/125
See application file for complete search history.

(56) References Cited

U.S. PATENT DOCUMENTS

| | | | |
|---|---|---|---|
| 4,869,999 A | 9/1989 | Fukuda et al. | |
| 4,937,619 A | 6/1990 | Fukuda et al. | |
| 6,252,651 B1 | 6/2001 | Fujisawa et al. | |
| 6,358,856 B1 | 3/2002 | Lyons et al. | |
| 6,452,662 B2 | 9/2002 | Mulkens et al. | |
| 6,664,011 B2 | 12/2003 | Lin et al. | |
| 6,839,125 B2 | 1/2005 | Hansen | |
| 2002/0095234 A1* | 7/2002 | Yoshida | 700/125 |
| 2002/0166107 A1 | 11/2002 | Capodieci et al. | |
| 2002/0177054 A1 | 11/2002 | Saitoh et al. | |
| 2003/0073013 A1 | 4/2003 | Hsu et al. | |
| 2003/0104286 A1 | 6/2003 | Lin et al. | |
| 2004/0033426 A1 | 2/2004 | Den Boef et al. | |
| 2004/0158808 A1 | 8/2004 | Hansen | |
| 2004/0180294 A1 | 9/2004 | Baba-Ali et al. | |

OTHER PUBLICATIONS

D. L. White, et al., "Lithographic Projectores with Dark-Field Illumination," J. Vac. Sci. Technol. B17(6), pp. 3301-3305 (1999).
D. L. White et al., "Phase-Mask Effects by Dark-Field Lithography," Proceedings of the SPIE, vol. 4000, pp. 366-372 (Mar. 2000).
John S. Petersen et al., "Optical Lithographic Performance and Resolution Using Strong Dark-Field Phase Shifting of Discrete Patterns", GaAs MANTECH, International Conference on Compound Semiconductor-Manufacturing Technology (2001).
Obert R. Wood, et al., "Printing High-Density Patterns with Dark-Field 193 nm Lithography", Proceedings of the SPIE, vol. 4346, pp. 1470-1477 (2001).
George E. Bailey, et al., "Dark-Field High-Transmission Chromeless Lithography", Proceedings of the SPIE, vol. 5040, pp. 203-214 (2003).

* cited by examiner

*Primary Examiner*—Peter B Kim
(74) *Attorney, Agent, or Firm*—Pillsbury Winthrop Shaw Pittman LLP

(57) ABSTRACT

A method of transferring an image of a mask pattern onto a substrate with a lithographic apparatus is presented. The lithographic apparatus includes an illumination system configured to provide an illumination configuration and a projection system. In an embodiment of the invention, the method includes illuminating a mask pattern with an illumination configuration that includes a dark field component; and projecting an image of the illuminated pattern onto the substrate at a plurality of positions spaced apart from a reference plane that substantially coincides with or is substantially parallel to a surface of the substrate.

24 Claims, 24 Drawing Sheets

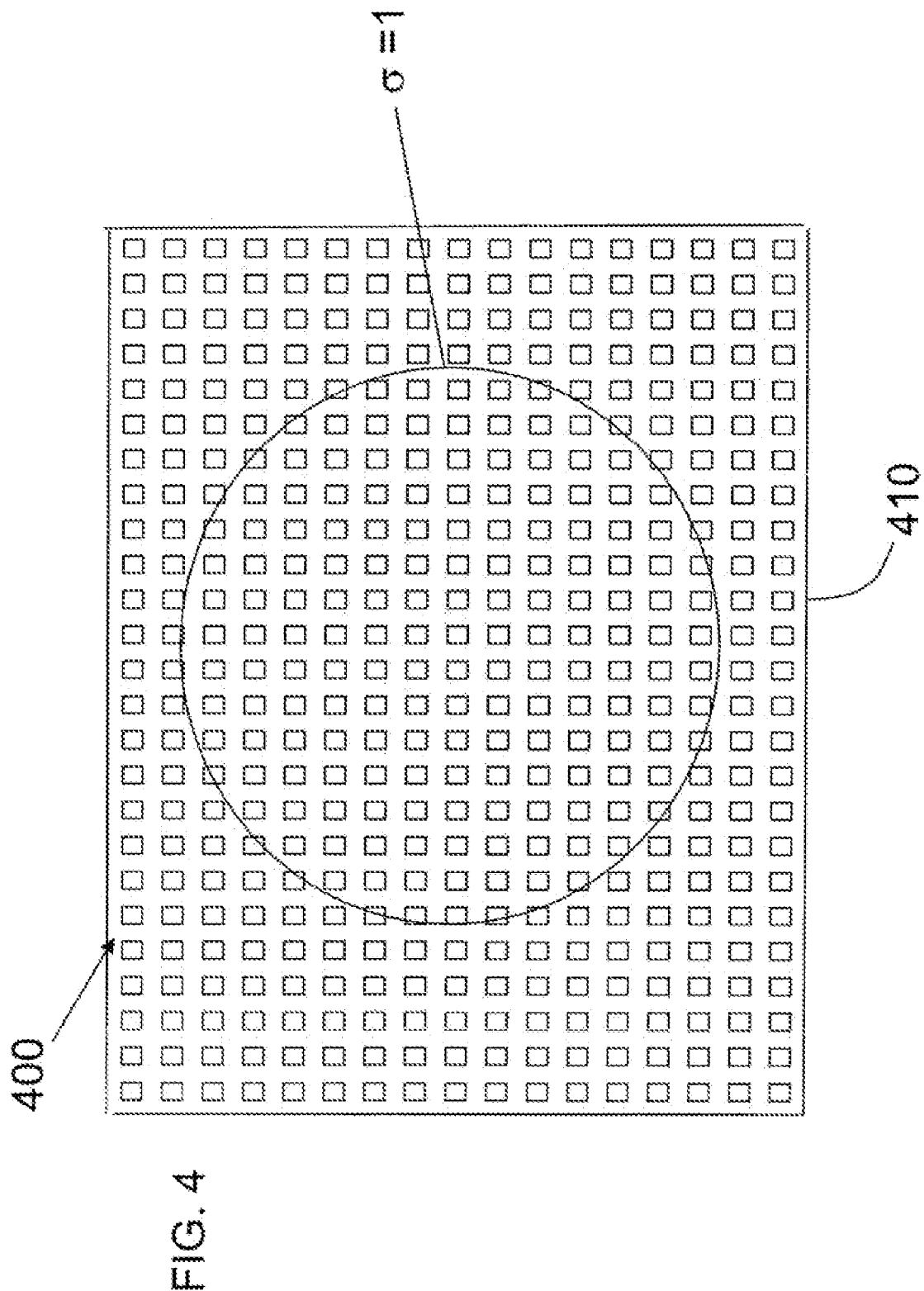

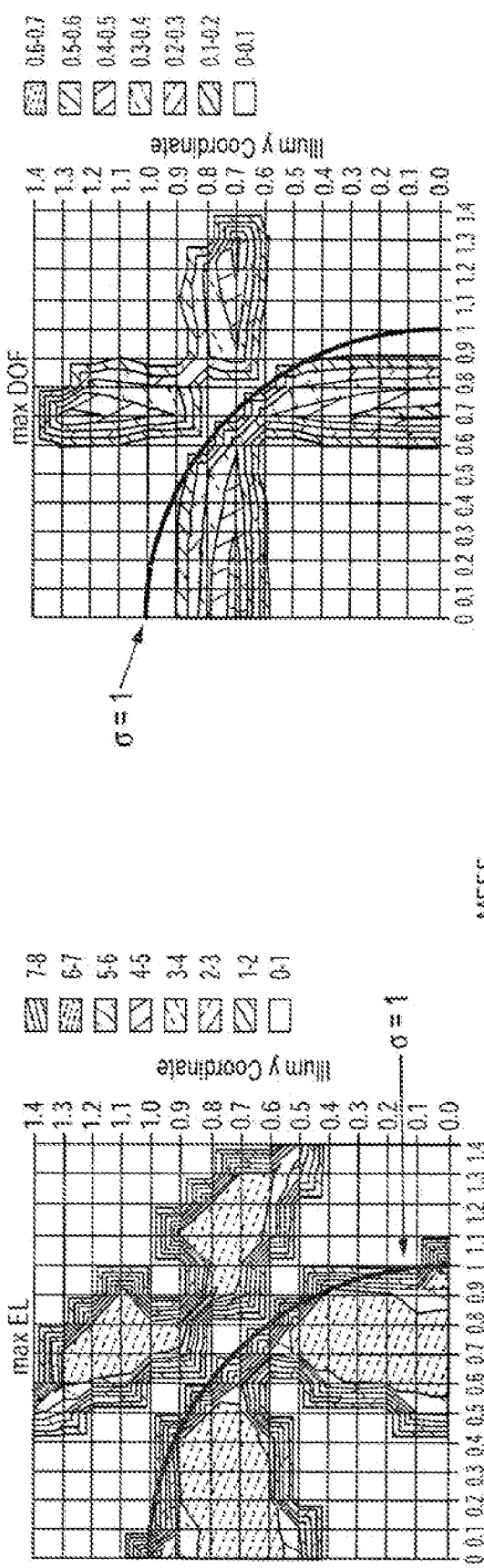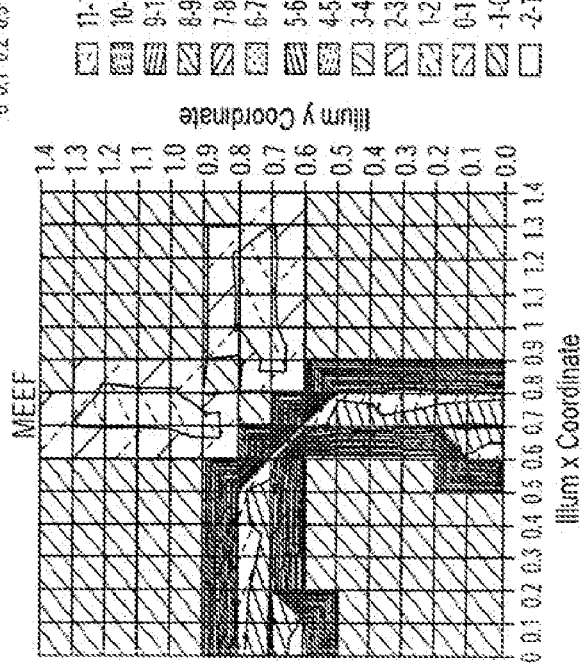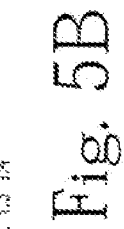
Fig. 5A
Fig. 5B
Fig. 5C

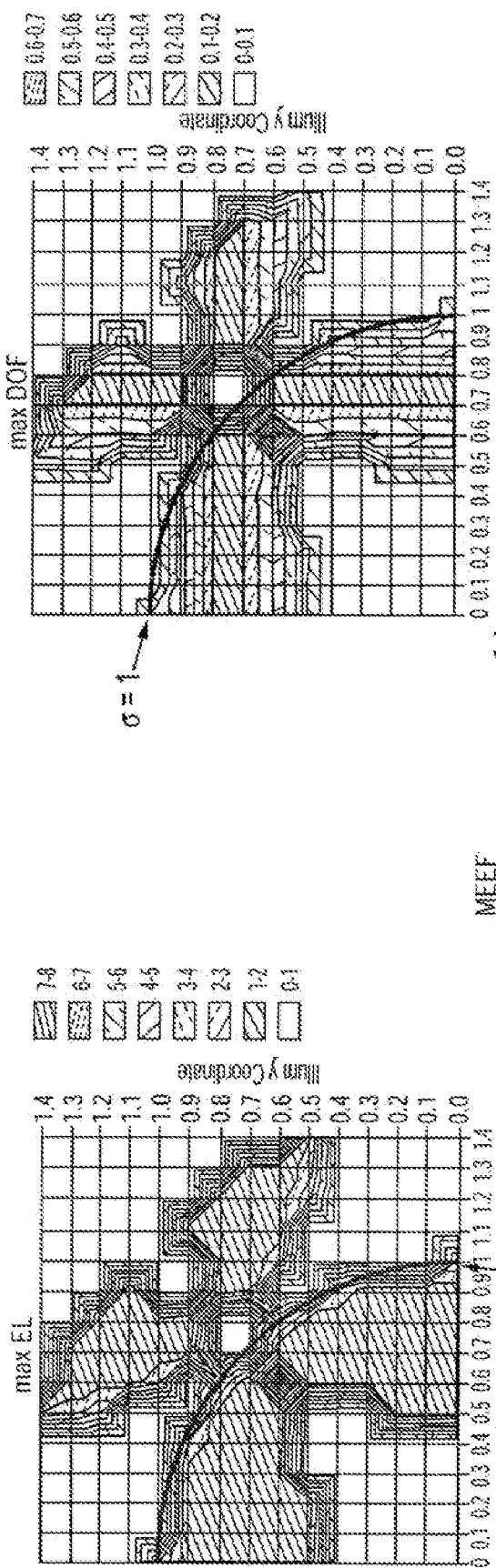
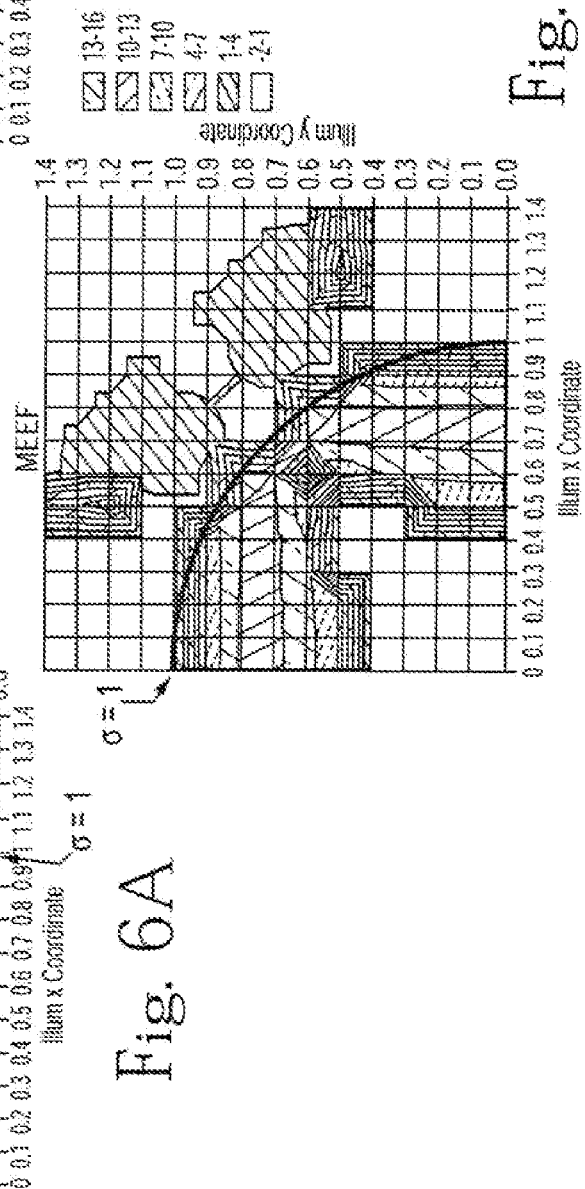
Fig. 6A
Fig. 6B
Fig. 6C

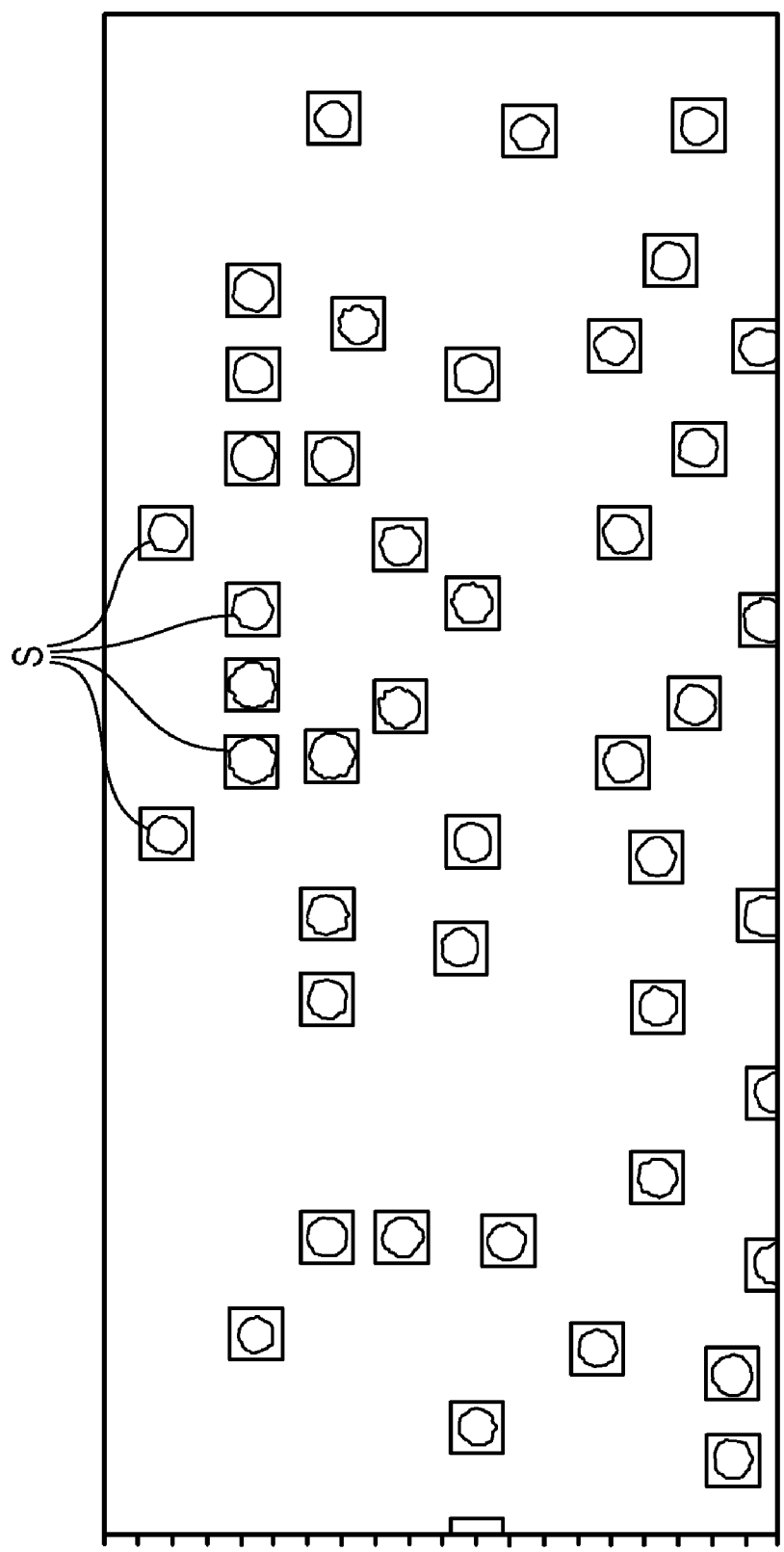

LITHOGRAPHIC APPARATUS AND DEVICE MANUFACTURING METHOD

FIELD

This application is a continuation-in-part of co-pending U.S. patent application Ser. No. 11/129,556, filed on May 16, 2005, entitled "Lithographic Apparatus and Device Manufacturing Method," the content of which is incorporated herein by reference in its entirety.

FIELD

This invention relates to a lithographic apparatus and a lithographic method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., including part of, one or several dies) on a substrate (e.g., a silicon wafer) that has a layer of radiation-sensitive material (resist). In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or anti-parallel to this direction.

Photolithography is widely recognized as one of the key steps in the manufacture of ICs. At present, no alternative technology seems to provide the desired pattern architecture with similar accuracy, speed, and economic productivity. However, as the dimensions of ICs and/or other devices made using photolithography become smaller, photolithography is becoming one of the most, if not the most, critical gating factors for enabling miniature IC or other structures to be manufactured on a truly massive scale.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the critical dimension, i.e. the smallest space between two features of a pattern (such as, for example, lines or contacts), permitted in the fabrication of a device layer and/or the smallest width of a line or any other feature. In the context of an array of features characterized by a certain pitch at which the features are spaced in the array, the dimension CD in Equation 1 represents the value of half of a minimum pitch that can be printed lithographically, referred to hereinafter as the "half-pitch".

It follows from equation (1) that a reduction of the minimum printable size of features can be obtained in three ways: by shortening the exposure wavelength $\lambda$, by increasing the numerical aperture $NA_{PS}$ or by decreasing the value of $k_1$.

Current resolution enhancement techniques that have been extensively used in lithography to lower the Rayleigh constant $k_1$, thereby improving the pattern resolution, include the use of phase shift masks and the use of off-axis illumination. These resolution enhancement techniques are of particular importance for lithographic printing and processing of contact holes or vias which define connections between wiring levels in an IC device, because contact holes have, compared to any other IC features, a relatively small area. Contact holes may for example be printed using conventional on-axis illumination in combination with a dark-field alternating-aperture phase shift mask, and further using positive resist. With such an arrangement, only the plus and minus first order diffracted beams emanating from a dense pattern of contact holes on the reticle are capable of traversing the projection system pupil to contribute to imaging, resulting in an enhanced depth of focus. When compared to using on-axis illumination in combination with a dark-field binary mask (with transmissive holes in a chrome layer to pattern the radiation beam) an improved resolution is obtained as well.

Alternatively, contact holes may for example be printed using off-axis illumination in combination with either a dark field binary mask or a dark field 6% attenuated phase shift mask, in combination with the use of positive resist. Here the off-axis illumination improves resolution and depth of focus in a similar way, whereby only one first order diffracted beam and the zeroth order beam emanating from the reticle pattern traverse the projection system pupil to contribute to imaging. One of the imaging quality parameters of relevance for high resolution lithography is the Mask Error Enhancement Factor, referred to by MEEF. Errors in the size of features of the mask pattern may appear enhanced by the factor MEEF in the projected image at wafer level. In particular the imaging of contact holes by means of dark field masks such as described above features a relatively large MEEF, which may become out of tolerance when pushing lithography to the processing of features with ever smaller critical dimension CD. At present, the use of attenuated phase shift masks or binary masks with off axis illumination may not be feasible for patterning contact holes below about 85 nm (at $\lambda$=193 nm, $NA_{PS}$=0.93, and $k_1$=0.4). The techniques mentioned above, based on the use of positive resist, therefore have limited capabilities and may not provide sufficient process latitude (i.e. the combined usable depth of focus and allowable variance of exposure dose for a given tolerance in the critical dimension) for printing half-pitches below a CD obtainable when operating at $k_1$=0.4.

An alternative solution that was recently proposed to print half pitches in the regime below $k_1$=0.4 with sufficient process latitude is to use a vortex mask. (See Mark D. Levenson et al., "The Vortex Mask: Making 80 nm Contacts with a Twist!," 22$^{nd}$ Annual BACUS Symposium on Photomask Technology, Proceedings of SPIE Vol. 4889 (2002)). A vortex mask is composed of rectangles with phases of 0 degrees, 90 degrees, 180 degrees and 270 degrees. The walls of the phase trenches are nearly vertical, with all four-phase regions meeting at sharp corners, which define the phase singularities. Because the phase of the wave front is not defined at the corner where the rectangles with the four different phases meet, the intensity at that point is necessarily equal to zero in accordance with the laws of physics. In other words, the central core of the vortex must be dark. Therefore, after traversing the vortex mask, the radiation wavefront spirals like a vortex and has a zero amplitude at its central core, instead of forming a plane or a sphere. In combination with a negative resist process, the central axis dark spot of the optical vortex transferred onto the substrate can potentially support larger process windows at small $k_1$ (based on half-pitch) than conventional methods and can allow for smaller holes to be printed with acceptable process latitude. However, a successful implementation of this technology will need the development of appropriate negative-resist tone processes which may be complicated and costly.

SUMMARY OF THE INVENTION

Embodiments of the invention include a method of transferring an image of a mask pattern onto a substrate with a lithographic apparatus. The lithographic apparatus includes an illumination system having a pupil plane and configured to provide an illumination configuration and a projection system having a numerical aperture. In an embodiment of the invention, the method includes illuminating a mask pattern with an illumination configuration that includes a dark field component; and projecting an image of the illuminated pattern onto a photoresist layer coated on the substrate.

In another embodiment of the invention, there is provided a lithographic apparatus including an illumination system having a pupil plane and configured to illuminate a mask pattern with an illumination configuration that includes a dark field component; a substrate table configured to hold a substrate; and a projection system having a numerical aperture and configured to project an image of the illuminated mask pattern onto a photoresist layer coated on the substrate.

In a further embodiment of the invention, there is provided a method for configuring the optical transfer of a pattern onto a substrate using a lithographic apparatus, the lithographic apparatus including an illuminator configured to condition a beam of radiation and a projection system, the method including dividing the beam of radiation in the illuminator into individual source points; calculating a separate lithographic response for each of a plurality of the individual source points such that a zero diffraction order beam of a diffraction pattern generated by the pattern for each of the plurality of individual source points is outside a maximum numerical aperture of the projection system; and determining an illumination shape of the illuminator based on analysis of the separate lithographic responses.

In another embodiment of the invention, there is provided a computer program product having machine-executable instructions, the instructions executable by a machine to perform a method for configuring the optical transfer of a mask pattern onto a substrate using a lithographic apparatus, the lithographic apparatus including an illuminator and a projection system. The method includes dividing the beam of radiation in the illuminator into individual source points; calculating separate lithographic response for each of a plurality of the individual source points such that a zero diffraction order beam of a diffraction pattern generated by the mask pattern for each of the plurality of individual source points is outside a maximum numerical aperture of the projection system; and determining an illumination shape of the illuminator based on analysis of the separate lithographic responses.

In yet another embodiment of the invention, there is provided a lithographic apparatus, including a support structure configured to support a patterning device which can be used to pattern a beam of radiation according to a desired pattern; a substrate table configured to hold a substrate; a projection system configured to project the patterned beam onto a target portion of the substrate; a processor configured to divide the beam of radiation in the illuminator into individual source points, to calculate separate lithographic response for each of a plurality of individual source point such that a zero diffraction order beam of a diffraction pattern generated by the pattern for each of the plurality of the individual source points is outside a maximum numerical aperture of the projection system, and to determine an illumination shape of the illuminator based on analysis of the separate lithographic responses, and a selectably variable beam controller that is adapted to modify a cross-sectional intensity distribution in the beam of radiation, before the beam of radiation reaches the patterning device, in accordance with the illumination shape determined by the processor.

A device manufacturing method in accordance with an embodiment of the invention includes: illuminating a mask pattern of a phase shift mask with a beam of radiation that includes a dark field component; and exposing a positive resist layer with the beam of radiation transmitted by the phase shift mask to form an image of the mask pattern in the positive resist layer, the image in the positive resist layer being of an opposite tone of an image that is produced when the mask pattern is illuminated with a beam of radiation corresponding to sigma $\leq 1$. Sigma is a ratio between a numerical aperture of an illumination system that illuminates the mask pattern with the beam of radiation and a numerical aperture of a projection system that projects the image of the mask pattern onto the resist layer.

In an embodiment, there is provided a method of transferring a pattern image onto a substrate with a lithographic apparatus, the lithographic apparatus including an illumination system having a pupil plane and configured to provide an illumination configuration and a projection system having a numerical aperture, the method including illuminating a patterning device pattern with an illumination configuration that includes a dark field component; and projecting an image of the illuminated pattern onto the substrate at a plurality of positions spaced apart from a reference plane that substantially coincides with or is substantially parallel to a surface of the substrate.

In another embodiment, there is provided a lithographic apparatus, including an illumination system having a pupil plane and configured to illuminate a patterning device pattern with an illumination configuration that includes a dark field component; a substrate table configured to hold a substrate; and a projection system configured to project an image of the illuminated pattern onto the substrate, wherein the lithographic apparatus is configured to project the image of the illuminated pattern at a plurality of positions spaced apart from a reference plane that substantially coincides with or is substantially parallel to a surface of the substrate.

In yet another embodiment, there is provided a computer product having machine executable instructions, the instructions being executable by a machine to perform a method of transferring a pattern image onto a substrate with a lithographic apparatus, the lithographic apparatus including an illumination system having a pupil plane and configured to provide an illumination configuration and a projection system having a numerical aperture, the method including: illuminating a patterning device pattern with an illumination configuration that includes a dark field component; and projecting an image of the illuminated pattern onto the substrate at a plurality of positions spaced apart from a reference plane that substantially coincides with or is substantially parallel to a surface of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 shows a grid of source points that represents a discretization of the illumination beam;

FIGS. 5a-c are contour maps representing simulated values of the maximum exposure latitude, the maximum depth of focus and the mask error enhancement factor as a function of source point location, wherein the illumination radiation has a wave length of 193 nm, the mask pattern studied is a grid of 75 nm holes having a 140 nm pitch of a binary mask and the numerical aperture of the projection system is 0.93;

FIGS. 6a-c are contour maps representing simulated values of the maximum exposure latitude, the maximum depth of focus and the mask error enhancement factor as a function of source point location, wherein the mask pattern studied is a grid of 110 nm holes having a 220 nm pitch of a 6% attenuated phase shift mask and the numerical aperture of the projection system is 0.6;

FIG. 11b shows a simulated cross section of an on-axis illumination configuration used to print the 75 nm isolated line of FIG. 11a;

FIG. 11c is a simulated profile of the 75 nm isolated line (top view) shown in FIG. 11a;

FIG. 13a shows a simulated cross section of an illumination configuration that may be used to print the isolated 75 nm trench of FIG. 11a;

FIG. 13b shows simulated variation of exposure latitude as a function of depth of focus for the layout of FIG. 11a;

FIG. 22 shows the simulated pattern of FIG. 15 obtained with the combination of the illumination of FIG. 20c and a 0.5 μm focus variation.

DETAILED DESCRIPTION OF THE INVENTION

Figure 1:
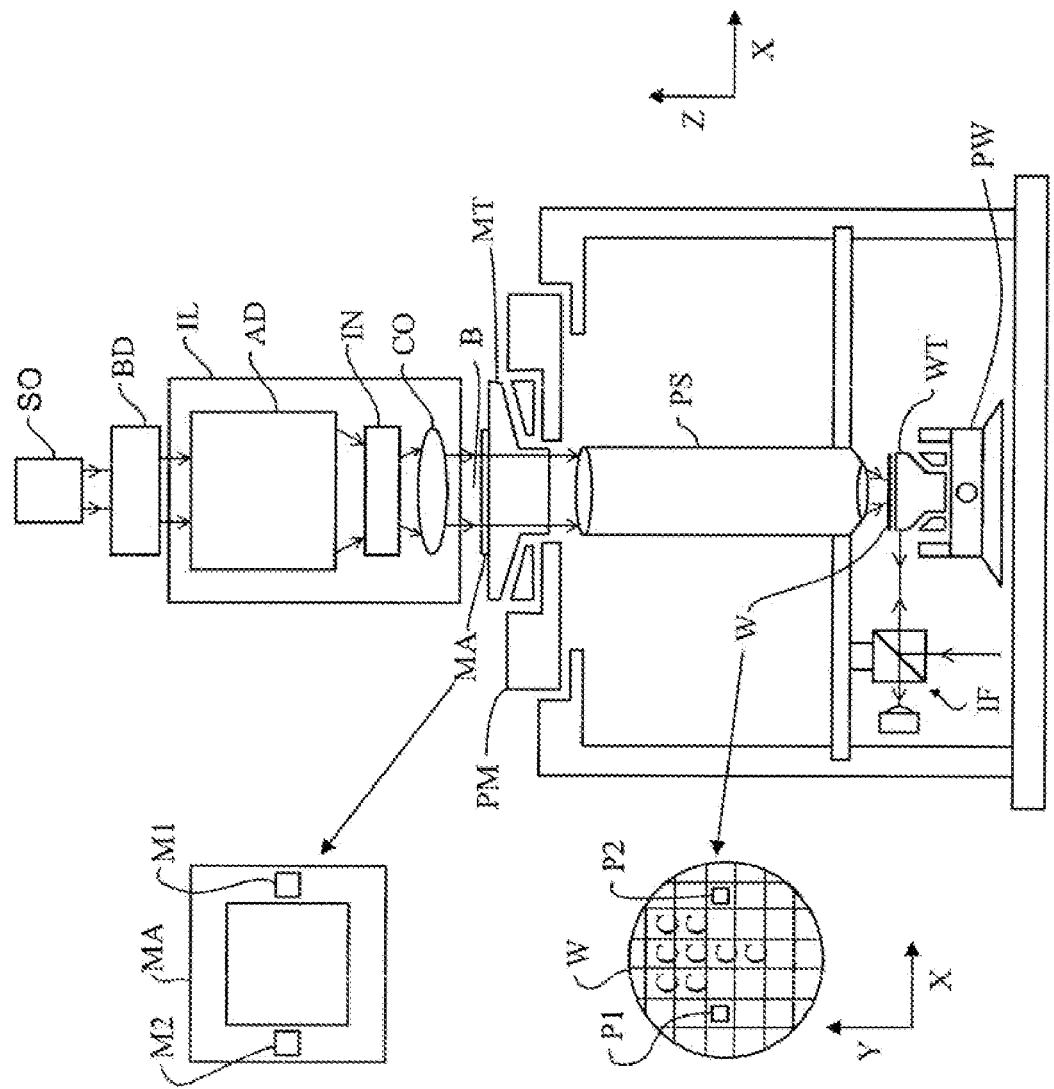
FIG. 1 represents a lithographic apparatus in accordance with an embodiment of the invention.

FIG. 1 schematically depicts a lithographic apparatus according to an embodiment of the invention. The apparatus includes an illumination system (illuminator) IL adapted to condition a beam B of radiation (e.g., UV radiation) and a support structure (e.g., a mask table) MT configured to hold a patterning device (e.g., a mask) MA and connected to a first positioning device PM configured to accurately position the patterning device with respect to the projection system PS. The apparatus also includes a substrate table (e.g., a wafer table) WT configured to hold a substrate (e.g., a resist-coated wafer) W and connected to a second positioning device PW configured to accurately position the substrate with respect to the projection system PS. The apparatus also includes a projection system (e.g., a refractive projection lens) PS adapted to image a pattern imparted to the beam B by the patterning device MA onto a target portion C (e.g., including one or more dies) of the substrate W.

As depicted here, the apparatus is of a transmissive type (e.g., employing a transmissive mask). Alternatively, the apparatus may be of a reflective type (e.g., employing a programmable mirror array of a type as referred to below).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD, including for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The projection system PS may comprise a diaphragm with an adjustable clear aperture used to set the numerical aperture of the projection system PS at wafer level at a selected value. The selectable numerical aperture, or in the case of a fixed clear aperture the fixed numerical aperture, will be referred to as $NA_{PS}$. At reticle level a corresponding angular capture range within which the projection system PS is capable of receiving rays of radiation of the beam of radiation is given by the object-side numerical aperture of the projection system PS, referred to as $NA_{PSOB}$. The object-side numerical aperture of the projection system PS is denoted by $NA_{PSOB}$. Projection systems in optical lithography are commonly embodied as reduction projection systems with a reduction ratio M of, for example, 5× or 4×. A numerical aperture $NA_{PSOB}$ is related to $NA_{PS}$ through the reduction ratio M by $NA_{PSOB}=NA_{PS}/M$. The beam of radiation B provided by the illumination system IL to the mask MA comprises a plurality of light rays with a corresponding plurality of angles of incidence at the mask, defined with respect to the axis Z in FIG. 1. These rays can therefore be characterized by an illumination numerical aperture $NA_{IL}$ in accordance with $NA_{IL}$=Sin (angle of incidence), where the index of refraction of the space upstream of the mask is assumed to be 1. However, instead of characterizing an illumination light ray by its $NA_{IL}$, the ray may alternatively be characterized by the radial position of the corresponding point traversed by that ray in a pupil of the illumination system. That radial position is linearly related to $NA_{IL}$, and it is common practice to define a corresponding normalized radial position σ in a pupil of the illumination system by $σ=NA_{IL}/NA_{PSOB}$.

In addition to an integrator IN and a condenser CO, the illumination system typically comprises an adjusting device AM configured to set an outer and/or inner radial extent (commonly referred to as σ-outer and σ-inner, respectively) of the intensity distribution in the pupil of the illumination system. In view of the normalization, when σ-outer=1 light rays traversing the edge of the illumination pupil can just be captured (in the absence of diffraction by the mask MA) by the projection system PS, because then $NA_{IL}=NA_{PSOB}$.

The beam of radiation B is incident on the patterning device MA, which is held on the support structure MT. Having traversed the patterning device MA, the beam of radiation B passes through the projection system PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam B. Similarly, the first positioning device PM and another position sensor (which is not explicitly depicted in FIG. 2) can be used to accurately position the patterning device MA with respect to the path of the beam B, e.g., after mechanical retrieval from a mask library, or during a scan. In general, movement of the support structure MT and substrate table WT will be realized with the aid of a long-stroke module (coarse positioning) and a short-stroke module (fine positioning), which form part of one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus may be used in the following preferred modes:

1. In step mode, the support structure MT and the substrate table WT are kept essentially stationary, while an entire pattern imparted to the beam of radiation is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam of radiation is projected onto a target portion C (i.e., a single dynamic exposure). The velocity and direction of the substrate table WT relative to the support structure MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations of the above described modes of use or entirely different modes of use may also be employed.

When a pattern is illuminated with a coherent beam of radiation, it generates a diffraction pattern and the angles at which the radiation is diffracted are determined by the spatial frequency components of the pattern. For example, an infinite line/space pattern which has a single spatial frequency defined by the pitch P of the line/space pattern diffracts coherent radiation (traveling to the pattern along the optical axis) in a direction perpendicular to the lines and spaces of the pattern at angles (or diffraction orders n, where n is an integer) that are defined by the following equation (2):

$$\theta=\sin^{-1}\{(n*\lambda)/P\} \quad (2)$$

An ideal projection system would capture all of the diffracted radiation and recombine it to form a perfect image of the original line/space pattern. In reality, projection systems have a finite angle over which they can capture the diffracted beams (corresponding to the numerical aperture $NA_{PSOB}$) and any diffracted radiation beyond this angle is lost. This leads to a degraded reconstruction of the image at the image plane or in the case where none of the diffracted radiation is captured by the projection system, no imaging at all.

Figure 2B:
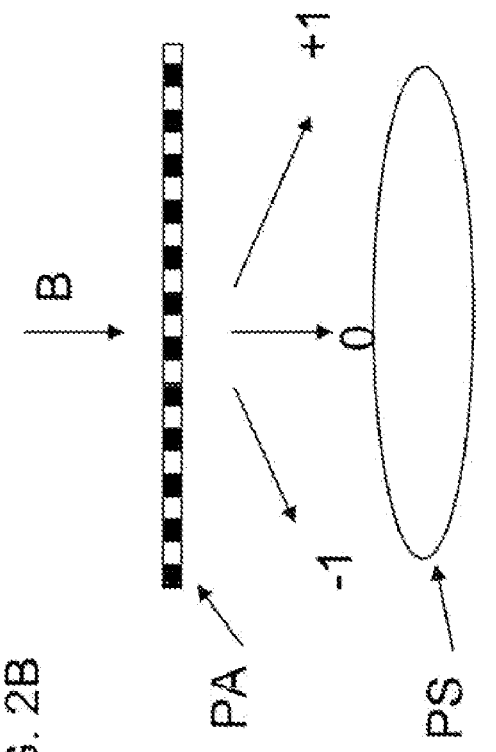
FIGS. 2a-d are schematic illustrations showing the diffraction orders collected by the projection system for different ratios of the numerical aperture of the illumination system over the numerical aperture of the projection system.
Figure 2D:
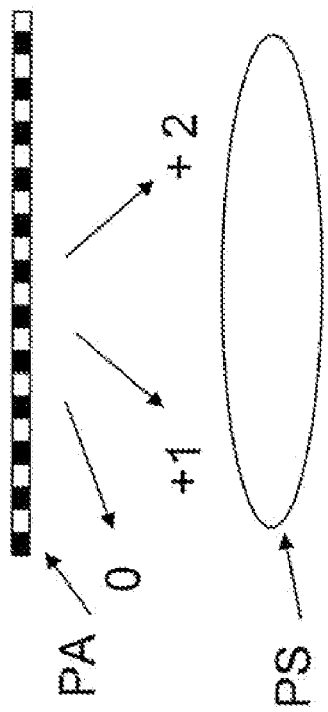
Figure 2A:
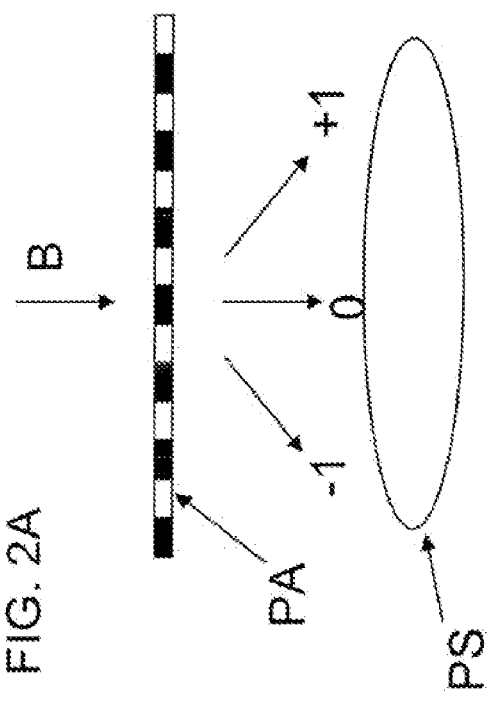

As such, as illustrated in FIGS. 2(a) and 2(b), if a line/space pattern PA is illuminated with a coherent beam of radiation B along the optical axis of a projection system PS, the minimum pitch ($P_{min}$) as present in the image at wafer level that would still allow for the +/−1 diffraction order to be captured by the projection system PS can be expressed by:

$$P_{min} = \lambda / NA_{PS} \qquad (3)$$

As shown in FIG. 2(a), which illustrates a pattern PA having a pitch Pmin, and FIG. 2(b), which illustrates a pattern having a pitch smaller than Pmin, as the pitch is reduced, it is no longer possible for the projection system PS to capture either the +/−−1 diffraction order.

Figure 2C:
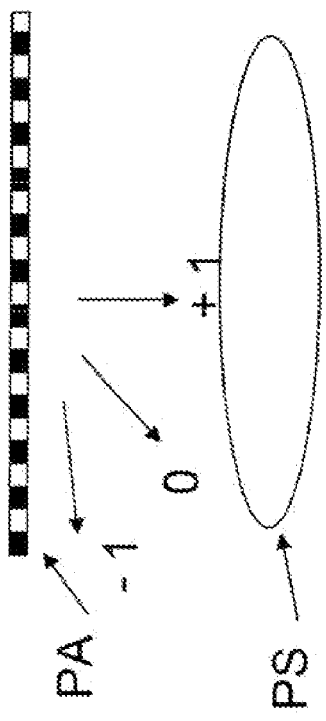

However, referring to FIG. 2(c), if the coherent beam B is tilted with respect to the optical axis (off axis illumination or OAI) out to the edge angular capture range of the projection system PS, the +1 diffraction order could then be captured by the projection system. In this case, the σ value for the incoming illumination beam approaches a value of 1.0.

Beyond this limit, i.e., for the case where the illumination beam B only comprises light rays with σ>1, "normal" imaging cannot occur because (and in the sense that) the projection system does not capture any zero$^{th}$ order diffracted beam generated by the illumination beam B. However, imaging with high diffraction orders may be possible, and the information contained in these high diffraction orders may be used advantageously for some lithographic problems (see FIG. 2(d)). This type of imaging may be referred to as imaging by means of dark-field illumination, named analogously to dark field microscopy, in reference to the fact that the zeroth diffraction order is not collected by the projection system. Notice that in the present application the concept "dark-field illumination" is defined independently from the commonly used concepts of dark-field reticle patterns and bright-field reticle patterns. It is proposed in embodiments of the present invention to use, in a lithographic process, patterning device illumination that originates from areas in the illumination pupil corresponding to areas outside the pupil of the projection system pupil, i.e., originating from points in the illumination pupil with a normalized radial coordinate σ>1.

Figure 3:
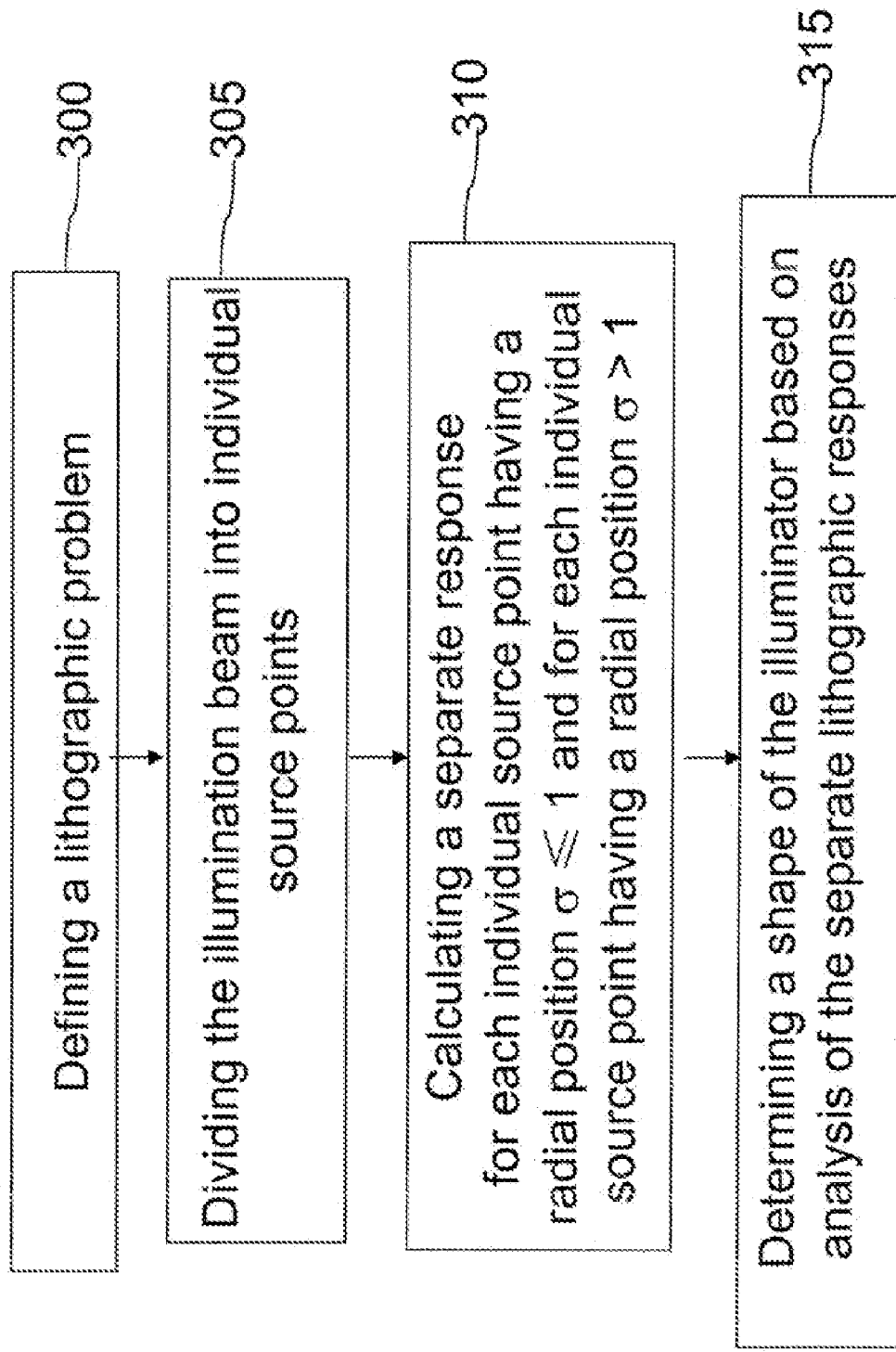
FIG. 3 illustrates a flowchart for configuring the optical transfer of a mask pattern onto a substrate in accordance with an embodiment of the invention.

FIG. 3 is a flowchart for configuring the optical transfer of a pattern onto a substrate in accordance with an embodiment of the invention.

The method begins at step 300, where a lithographic problem is defined. The lithographic problem represents a particular geometry of a pattern to be imaged onto a substrate. This pattern, which is used to optimize one or more parameters of the lithographic apparatus and to choose a proper configuration of the illumination system, is preferably representative of an aggressive configuration included in the patterning device layout. Such a pattern that could be used in order to reach a low $k_1$ value is, for example, a grid of contact holes. Contact features are increasingly becoming the most challenging patterns to print. Furthermore, for contact features, mask critical dimension errors are magnified by a mask error enhancement factor (MEEF) much larger than for other circuit features. MEEF corresponds to the incremental change in the final feature size printed on the target substrate per unit change in the corresponding pattern feature size (where the pattern dimension is scaled to substrate size by the reduction ratio of the imaging apparatus). Near the resolution limit of a lithographic apparatus, the MEEF often rises dramatically.

After defining the lithographic problem, the method then proceeds to step 305 where the beam of radiation, in the illuminator, is mathematically divided into a plurality of source points. In an implementation, a grid of source points representing a discretization of the illumination beam is defined in the pupil plane of the illuminator.

FIG. 4 shows a schematic representation of a grid of source points 400 for the illumination beam that is generated in the pupil plane of an illuminator. The source points contained in the file form a grid that spatially covers the entire cross-section of a clear aperture 410 in the pupil plane of the illuminator. FIG. 4 also illustrates the radial position of pupil points corresponding to the numerical aperture $NA_{PS}$ of the projection system at substrate level (points with σ=1). The superposition of the numerical aperture of the projection system on the source points grid provides an estimate of the source points that contribute to dark field illumination. The source points located outside the numerical aperture of the projection system provide dark field illumination. For these source points, a zeroth diffraction order associated with the diffraction pattern generated by the illuminated pattern is not captured by the projection system. Only higher diffraction orders may be captured by the projection system. This illumination configuration corresponds to σ>1. Conversely, the source points located inside the numerical aperture will have their zeroth diffraction order captured by the projection system. This situation corresponds to σ≦1.

The physical location of each light source point relative to the full illuminator aperture is set in the individual source points file and can be varied depending on the degree of accuracy desired. A small spacing between each light source point may provide more detailed information on the source response but may increase the calculation time. Conversely, a large spacing between each light source point may provide less accurate information on the source response but may decrease the calculation time. In an embodiment of the invention, the spacing of the grid relative to the full illuminator aperture is approximately 0.1. In other embodiments, the grid spacing is approximately 0.01 to 0.2. It will be appreciated that the grid of source points may be defined differently in other embodiments of the invention. For example, as an alternative to an illumination file, the grid of source points may be specified parametrically in the simulation software. Furthermore, it will be appreciated that the simulated grid may be interpolated to increase the grid point density.

Referring back to FIG. 3, the method then proceeds to step 310, where a lithographic response for each source point having a zeroth diffraction order located in the area with σ>1 (outside the numerical aperture of the projection system) is calculated. A similar calculation may be done for the source points having a zeroth diffraction order located in the area with σ≦1 (inside the projection system numerical aperture). Each of the separate responses may represent a result or series of results of simulations using the simulation model. In practice, an image of the pattern may be calculated by simulation and this image may be evaluated versus one or more criteria to judge whether the image has appropriate optical qualities to successfully print the desired pattern on the substrate. The procedure can be performed iteratively to arrive at the optimal value of the lithographic response. The image can be analyzed, for example, through a focus range to provide estimates of the exposure latitude and depth of focus. Additional lithographic responses that can be determined for each source point may include: a critical dimension of the pattern studied, an intensity threshold necessary to define the target critical dimension (CD) on the substrate, the depth of focus at 8% EL (DOF@8% EL), the dose-to-size $E_{1:1}$, dense to isolated feature bias, arbitrary feature size biases, sidelobe printing, film loss, sidewall angle, mask error enhancement factor (MEEF), linear resolution, absolute resolution, or critical dimension uniformity.

Lithographic simulations may be performed using different models. Examples of simulation models and methods to optimize a parameterized illumination shape may be found, for example, in U.S. patent application Ser. No. 10/361,831, filed on Feb. 11, 2003, entitled "Method for Optimizing an Illumination Source Using Full Resist Simulation and Process Window Metric," and U.S. patent application Ser. No. 10/716,439, filed on Nov. 20, 2003, entitled "Lithographic Apparatus and Method for Optimizing an Illumination Source Using Isofocal Compensation." The contents of these two applications are incorporated herein in their entirety by reference.

In an embodiment of the invention, a lithographic simulation may be performed with an aerial image model in order to determine the incident radiation energy distribution onto the radiation sensitive material (resist). Calculation of the aerial image may be done either in the scalar or vector form of the Fourier optics. Characteristics of the lithographic apparatus and process, like the numerical aperture (NA) or the specific pattern, may be entered as input parameters for the simulation. In practice, a simulation may be carried out with the aid of a commercially available simulator such as Prolith™, Solid-C™, Lithocruiser™ or the like. The quality of the aerial image may be determined by using a contrast or normalized aerial image log-slope (NILS) metric (normalized to the feature size). This value corresponds to the slope of the image intensity (or aerial image).

Relevant parameters to perform the aerial image simulation may include the distance from the focal plane of the Gaussian image plane, meaning the distance to the plane where the best plane of focus exists, as determined by geometrical ray optics, or the center wavelength of the quasi-monochromatic radiation source. The parameters may also include a measure of degree of spatial partial coherence of the illumination system, the numerical aperture of the projection system exposing the substrate, the aberrations of the optical system and a description of the spatial transmission function representing the pattern.

In another embodiment of the invention, a lithographic simulation may be performed with a resist model. In an implementation, the resist model may take into account, in the calculation of the critical dimension (or size) and its variation with variables such as dose/exposure energy and focus, the resist exposure, the resist baking and the resist developing. Likewise, the resist model may take into account, in an embodiment of the invention, a nonplanar topography and vector effects. The vector effects refer to the fact that an electromagnetic wave propagates obliquely when a high numerical aperture is used. Although vector effects can be accounted for when calculating the aerial image, a calculation of the vector effects in a low refractive index medium (e.g., in air) may greatly overestimate the contrast loss obtained on the substrate because the incident rays tend to be straightened when they propagate in the resist because of the resist's higher refractive index. Therefore, a resist model with a rigorous electromagnetic calculation may be desirable to accurately estimate the actual experimental response.

Additional models like a lumped parameter model or a variable threshold resist model may also be used in other embodiments of the invention. It will be appreciated that the simulation model is selected because it matches experimental data.

Referring back to FIG. 3, the method then proceeds to step 315, where a shape of the illumination beam based on analysis of the separate lithographic responses is determined. The actual realization of this illumination shape may be done with any appropriate beam shaper. U.S. Pat. No. 6,452,662 discloses, for example, a multimode generating element that could be used to generate the illumination shape. The content of that patent is incorporated herein in its entirety by reference. The multipole generating element, disclosed in that patent, includes four triangular blades insertable into the beam path at the pupil plane of the illumination system. This multimode generating element enables continuously variable quadrupole illumination modes to be produced. In another embodiment of the invention, a metal aperture plate filter or a diffractive optical element could be used to create the desired illumination shape.

The procedure for quantitatively defining the best conditions of illumination (source shape and mask bias) is performed iteratively. In practice, a candidate source shape and a mask bias are selected and tested in the simulator and then iteratively adjusted to get a high process latitude (i.e. optimized value for each lithographic response) with, for example, acceptable sidelobing. An iterative fitting algorithm may be used to cycle through the initial lithographic parameters in order to optimize the candidate source shape.

In order to qualitatively determine the candidate source shape, or illumination configuration, calculation results of selected lithographic responses may be visualized on contour maps. These contour maps show the values of lithographic responses as a function of source point location.

Referring to FIGS. 5a-c, an exemplary embodiment of contour maps obtained in accordance with an embodiment of the present invention is provided. FIGS. 5a-c correspond to the upper right hand quadrant of the illuminator pupil. As can be seen in these figures, the source point grid has a 0.1:0.1 spacing relative to the full aperture of the projection system, i.e., the spacing represents, along the x and y axes, an increment of σ by 0.1. In these Figures, the maximum radius for zero order light capture by the projection system is 1.0 (σ=1). For symmetry reasons, only the upper right hand quadrant of the illuminator need be visualized.

The lithographic problem studied in FIGS. 5a-c is a grid of 75 nm contact holes arranged in a 140 nm pitch of a dark-field binary mask (dimensions given in wafer scale). The wavelength of the radiation beam is 193 nm and the numerical aperture of the projection system is 0.93.

In FIG. 5a, the response studied is the maximum exposure latitude (max EL) using positive resist. The contour map represents the value of max EL obtained for the simulated resist pattern as a function of source point locations of the illumination beam in the illuminator. As can be seen in FIG. 5a, there are two regions inside the maximum numerical aperture of the projection system that have a significant contribution to a greater value of exposure latitude. The first region includes source points located between 0° and about 35° relative to the horizontal axis of the square grid mask pattern. This portion of the illuminator provides high contrast for the horizontal cuts through the holes. The second region includes source points located between about 55° and 90° relative to the horizontal axis of the square grid mask pattern. This portion of the illuminator provides high contrast for the vertical cuts through the holes. This figure also shows that illumination emanating outside the maximum numerical aperture of the projection system can also produce a favorable value of exposure latitude. These regions correspond to the poles centered at approximate coordinates (1.15, 0.75) and (0.75, 1.15), respectively. These poles provide a dark field illumination corresponding to a σ>1. In other words, non-diffracted radiation originating from these poles is lost from the projection system because it falls outside the numerical aperture of the projection system.

FIG. 5b shows a contour map for the maximum depth of focus response (max DOF). This figure indicates that, in addition to poles located within the maximum numerical aperture of the projection system, poles located outside the maximum numerical aperture of the projection system can produce a favorable value of depth of focus.

Referring now to FIG. 5c, the contour map of the mask error enhancement factor parameter (MEEF) as a function of source point location is represented. This contour map indicates that the poles located inside the maximum numerical aperture of the projection system (i.e., σ≦1), and identified in FIGS. 5a-b, yield an unacceptably high value of MEEF. Conversely, the poles located outside the maximum numerical aperture of the projection system provide a low MEEF value. This result indicates that a dark field illumination may yield a superior lithographic process.

FIGS. 6a-b show the contour maps obtained for the same parameters (i.e., max EL, max DOF and MEEF) with a grid of 110 nm holes having a 220 nm pitch imaged with a 6% attenuated phase shift mask. A 10 nm mask bias is used to print the mask pattern to the target size and the numerical aperture of the projection system is 0.6.

FIGS. 6a and 6b show similar results to those obtained with a binary mask. These contour maps indicate that illumination emanating from pupil areas both inside and outside the circle with σ=1 yields similar favorable values for exposure latitude and/or the depth of focus. Referring to FIG. 6c, it is shown that illumination poles located at σ>1, similar to those identified in FIG. 5c, yield a lower MEEF value than can be obtained with normal brightfield illumination.

Figure 7A:
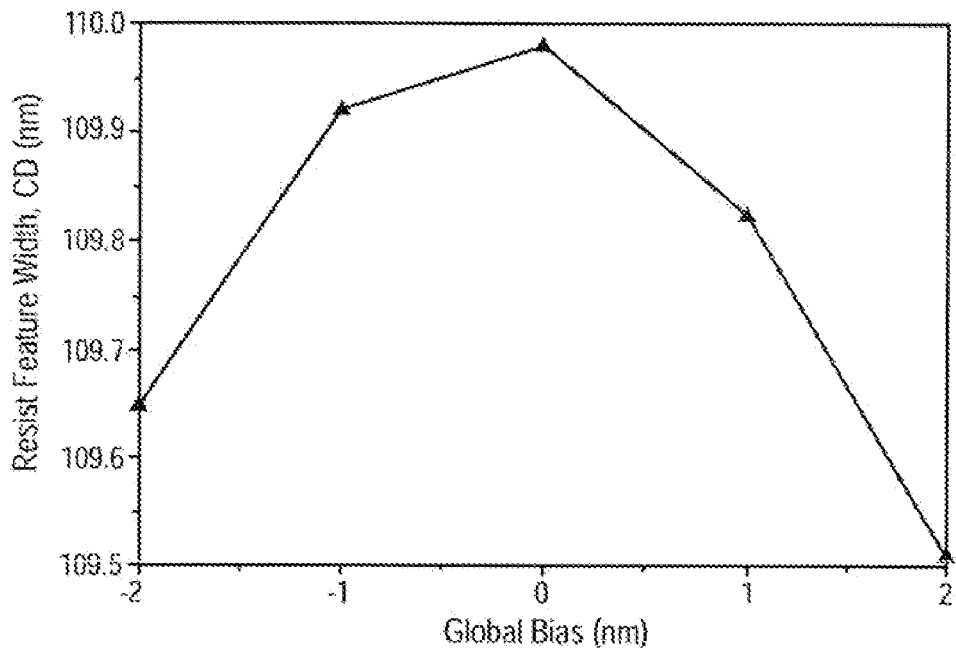
FIGS. 7a-c respectively show the simulated variation of the resist pattern as a function of global mask bias (centered at 20 nm), the simulated variation of the resist pattern CD as a function of defocus and dose, and the simulated variation of the exposure latitude as a function of depth of focus, wherein the resist pattern is a grid of 110 nm holes having a 220 nm pitch of a 6% attenuated phase shift mask and the numerical aperture of the projection system is 0.6.

FIG. 7a shows MEEF as a function of global bias (centered at 20 nm) for the pattern and mask type of FIGS. 6a-c (i.e., 110 nm holes having a 220 nm pitch imaged with a 6% attenuated phase shift mask). The conditions of illumination are the same as those used in FIGS. 6a-c, except for the mask bias which is set to 20 nm. Analysis of the contour maps of maximum depth of focus, MEEF and exposure latitude, in accordance with the method shown in FIG. 3, have enabled selection of an illumination configuration capable of providing good process latitude (in terms of depth of focus and exposure latitude) and low MEEF. This illumination configuration is shown in FIG. 7d and corresponds to a multipole illumination with poles having an angular radius (a tangential extent) of about 30°, and a radial extent given by σ-inner=1.06 and σ-outer=1.34. The location of the poles in FIG. 7d is such that no zero diffraction order light will be captured by the projection system. As can be seen in FIG. 7a, there is almost no variation of the critical dimension (CD) as a function of global bias variation, which leads to a MEEF value of about zero for this source shape.

Figure 7B:
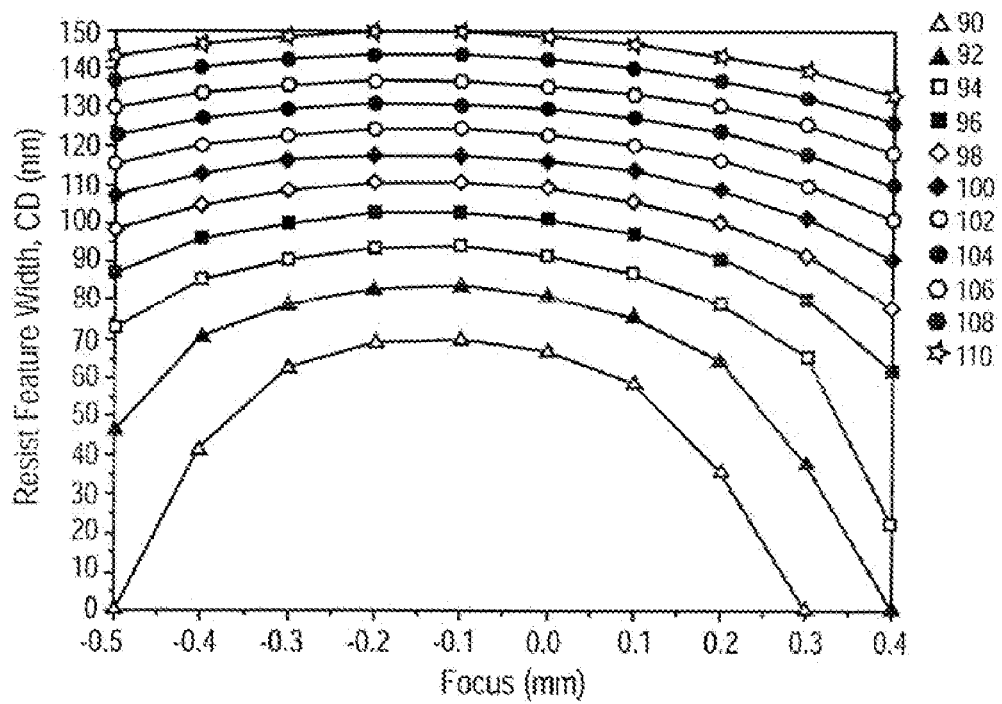
Figure 7C:
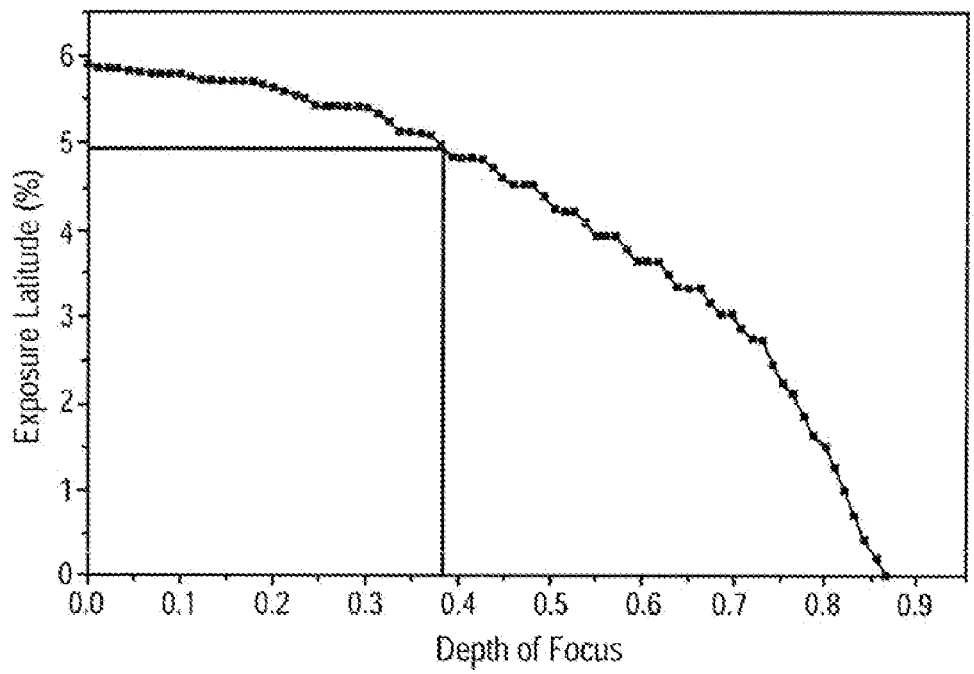
Figure 7D:
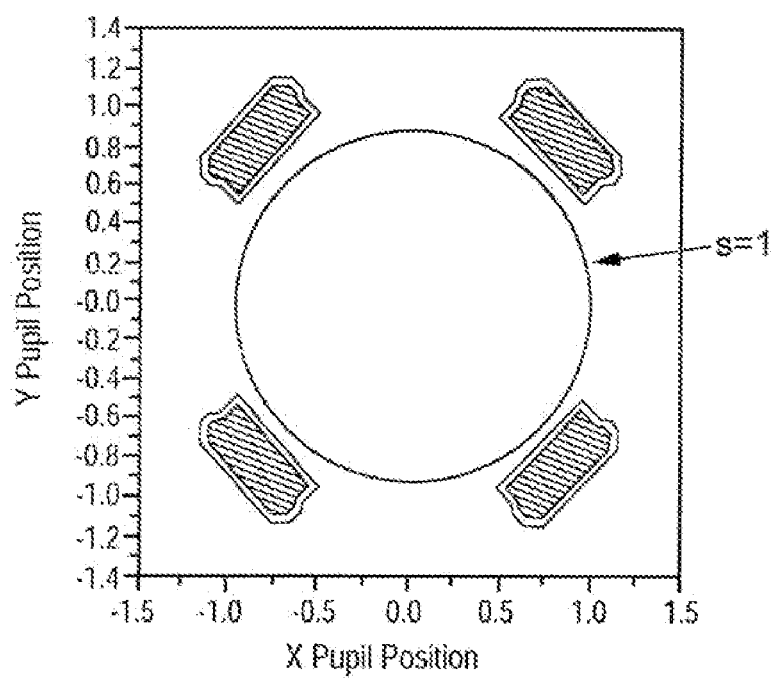
FIG. 7d shows a simulated cross section of the source shape in the pupil plane of the illumination system optimized in accordance with the method of FIG. 3 to illuminate the mask pattern defined in FIGS. 7a-c.

FIG. 7b shows a Bossung plot representing the variation of a 110 nm contact hole size with defocus for various exposure energies. This figure shows that for energies greater than about 94 mJ, there is little variation of the hole size with defocus (−0.5-+0.4 defocus). The target size for the hole is 110 nm FIG. 7c represents the variation of exposure latitude as a function of depth of focus obtained by analysis of FIG. 7b. It is shown that exposure latitude is 5% or more for a focus range of about 0.4 microns.

Referring now to FIGS. 8a-d, these figures show MEEF results obtained with a standard (both σ-inner and σ-outer <1) multipole illumination (which may be referred to as cross quadrupole or CQuad illumination) and a dark field multipole illumination. The lithographic parameters and the patterns studied are the same as those of FIGS. 5a-c. Namely, the lithographic problem studied is a grid of 75 nm holes arranged in a 140 nm pitch, imaged with a dark-field binary mask, the wavelength of the radiation beam is 193 nm, and the numerical aperture of the projection system is 0.93.

Figure 8A:
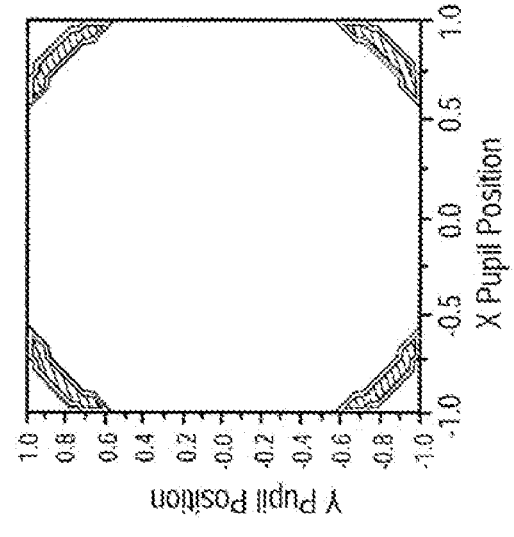
FIGS. 8a-b show, respectively, a simulated cross section of a multipole illumination and a dark field multipole illumination in the pupil plane of the illumination system.
Figure 8B:
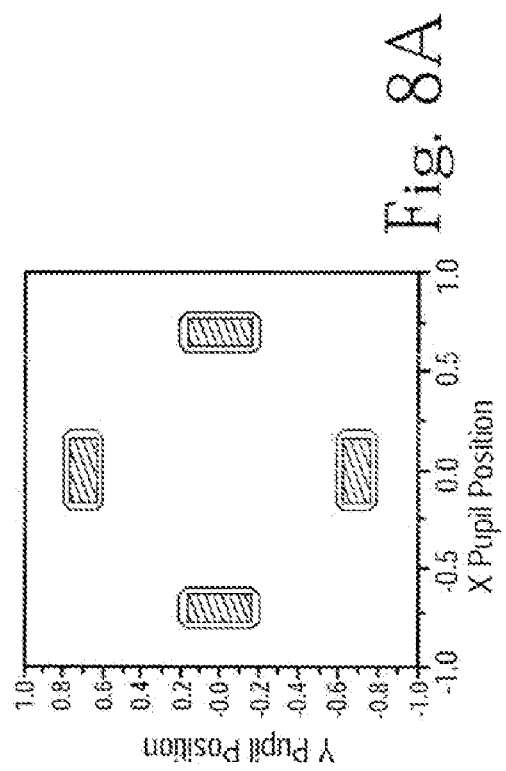

FIGS. 8a and 8b represent cross sections of the illumination intensity distribution in the pupil plane of the illumination system. FIG. 8a shows a multipole illumination configuration including poles located at 0°/180°, and +/−90° relative to the horizontal axis of the square grid mask pattern. These poles provide a direct illumination corresponding to σ<1. As such, non-diffracted radiation emanating from these poles is captured by the projection system. This source, shape was optimized using conventional methods to reduce MEEF. FIG. 8b shows dark field illumination, where in this case, all the included source points are located outside the area projection system numerical aperture. These source points define poles arranged at about +/−45° relative to the horizontal axis. This type of pole arrangement may be referred to as quadrupole dark field illumination. As shown in FIG. 5c, this dark field illumination mode contributes to a lower value of MEEF.

Figure 8C:
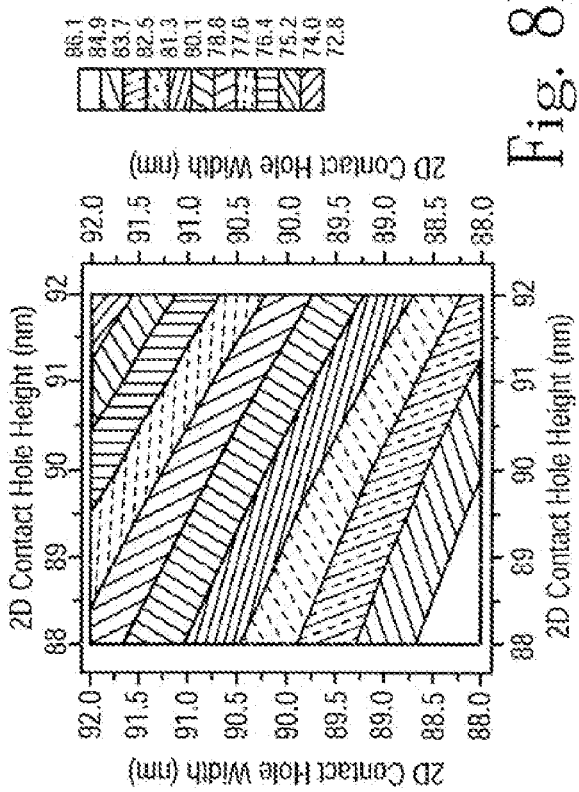
FIGS. 8c-d show simulated MEEF maps obtained with the multipole illumination of FIG. 8a, and the dark field multipole illumination of FIG. 8b.
Figure 8D:
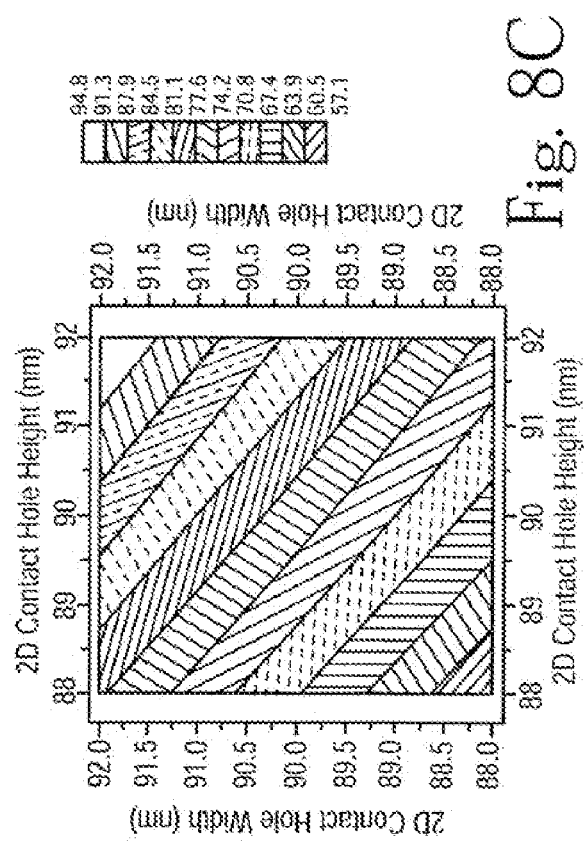

FIGS. 8c and 8d show CD maps that illustrate the influence of a mask CD errors on the printed contact hole (i.e., contact defined in the photoresist). These maps provide an estimate of MEEF obtained with the illumination configurations represented in FIGS. 8a and 8b. As can be seen in FIGS. 8c-d, the mask CD is centered at about 90 nm, and a 15 nm mask bias was used to print the 75 nm holes to the target size. In FIG. 8c, a 4 nm change in contact hole size at reticle level gives a 37 nm change in printed contact hole size when the pattern is illuminated with the source shape of FIG. 8a. This corresponds to a MEEF of about 9. By contrast, a 4 nm change in hole size only produces a −13.3 nm hole difference when the pattern is illuminated with the illumination configuration of FIG. 8b. Furthermore this corresponds to a negative MEEF of about −3. This unusual situation where a larger hole on the reticle actually prints a smaller hole on the wafer can be exploited by combining contributions from this region of the illuminator pupil with contributions from the bright field region (σ<1) to yield lower MEEF. This sort of "zero MEEF compensation" approach is analogous to isofocal compensation. Although the multipole illumination of FIG. 8a may be useful to print small pitches, it gives high MEEF when it is combined with standard binary or even attenuated phase shift masks, thereby making this process unsuitable for production use. On the other hand, the incorporation of dark field poles may significantly reduce MEEF.

Figure 9A:
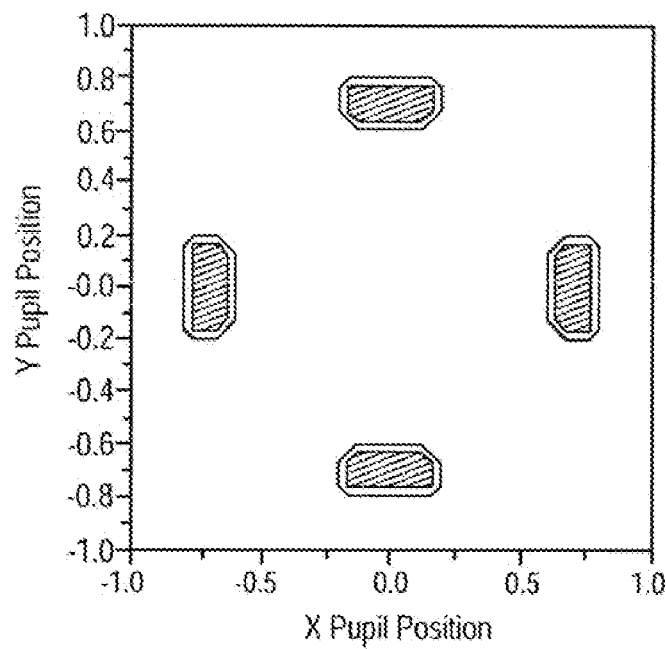
FIGS. 9a-b show two simulated multipole illumination configurations in accordance with an embodiment of the invention.
Figure 9B:
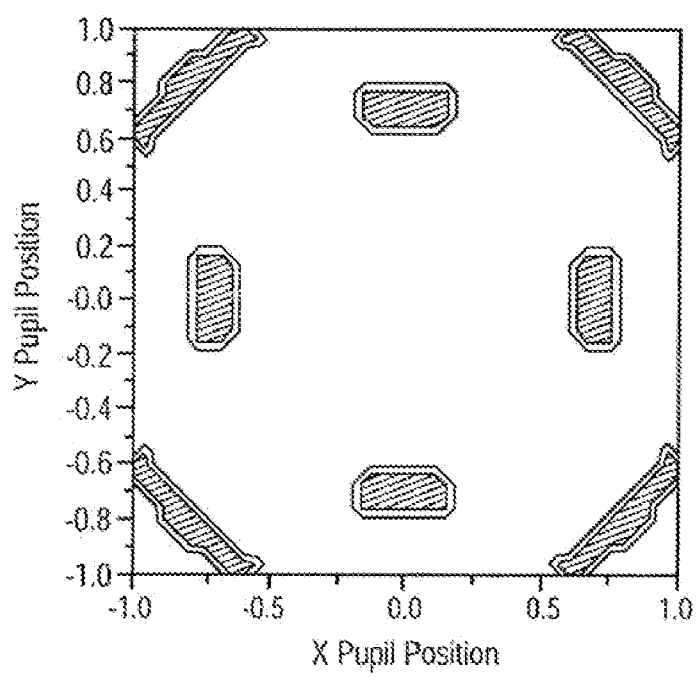

Referring now to FIGS. 9a-b, these figures show two multipole illumination configurations. FIG. 9a represents an illumination configuration that is substantially the same as that of FIG. 8a. FIG. 9b shows an illumination configuration combining two multipole illuminations: the multipole illumination of FIG. 9a (which can be referred to as CQuad type illumination) and a dark field multipole illumination. Critical dimension uniformity (CDU) calculations for a 75 nm hole grid arranged in a 140 nm pitch (binary mask) and printed with a 0.93 numerical aperture with radiation of a wavelength λ=193 nm were performed for each of these two illumination configurations. The CDU is representative of CD variations as a result of dose, focus and mask errors. In the present case, the CDU corresponds to the quadratic sum of CD variations due to dose, focus and mask errors. Results indicate that the multipole illumination of FIG. 9a gives a CDU of about 10.1 nm, whereas the multipole illumination of FIG. 9b (combination of CQuad illumination and dark field poles) provides a CDU of about 8.3 nm. For this hole pattern, the inclusion of dark field quasar poles is beneficial and improves CDU results due to MEEF reduction. Results can be further improved by refining dark field pole shape and increasing dark field pole relative intensity. In that case, even lower MEEF values may be obtained.

Figure 10A:
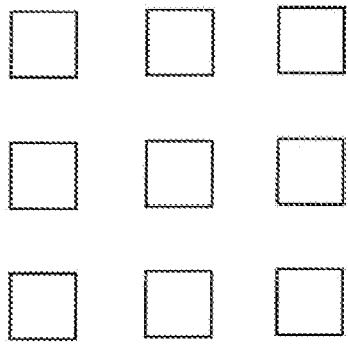
FIG. 10a shows a layout of a 75 nm hole (0° phase on 180° phase background) on a chromeless phase lithography mask. Holes are arranged in a grid with a 140 nm pitch.
Figure 10C:
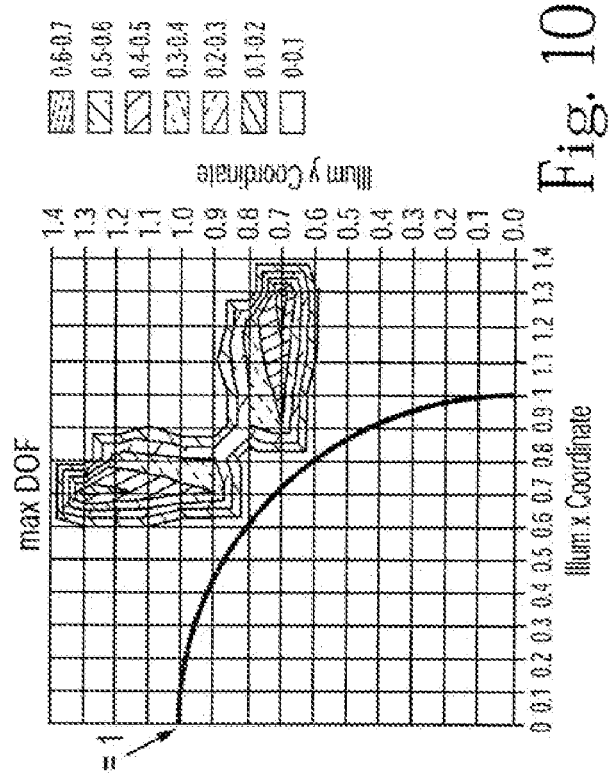
FIGS. 10b-c are simulated contour maps representing, respectively, values of maximum exposure latitude and maximum depth of focus as a function of source point location.
Figure 10B:
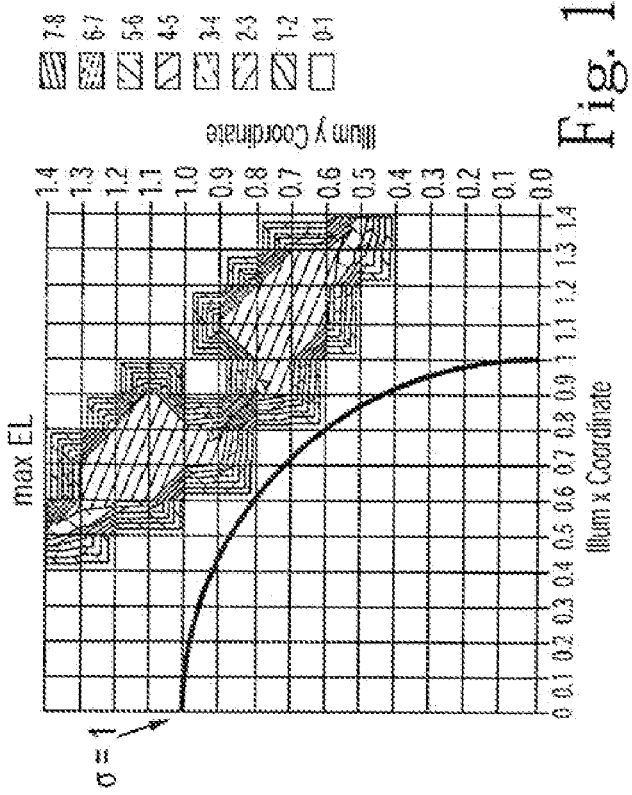

FIGS. 10a-c show results obtained with a chromeless phase lithography mask (also referred to as a CPL mask) and dark field illumination for a 75 nm hole grid, in accordance with an embodiment of the invention. CPL masks can be thought of as 100% transmission attenuated phase shift masks. In this embodiment, the hole pitch and the lithographic parameters are the same as those defined in the embodiment shown in FIGS. 5a-c (140 nm pitch, 75 nm hole and numerical aperture 0.93). Furthermore, calculations are performed for a positive resist. FIG. 10a illustrates a layout of a hole on the CPL mask (100% transmitting everywhere). This hole is defined in a 0° phase region arranged in a 180° phase background. FIGS. 10b-c show exposure latitude and depth of focus contour maps obtained with the CPL mask of FIG. 10a. These contour maps show that illumination emanating from the pupil area outside the circle σ=1 contributes to successful imaging of the holes by providing usable values for exposure latitude and the depth of focus. Results indicate that it is possible to print small holes in a positive resist with a CPL mask with high contrast using dark-field illumination. The exposure dose used is about 35 mJ/cm$^2$ to print the holes with the dark field illumination. Such results could not have been obtained via direct illumination (i.e., corresponding to (σ≦1) using a positive resist and a CPL mask.

One approach for printing isolated lines is to use on-axis illumination in combination with an alternating phase shift mask (alt-PSM). Alt-PSMs employ alternating areas of 0 and 180 degree-shifted quartz to form features on the substrate. Often chrome lines are also included on the mask to aid in the imaging. As the phase goes from positive to negative, the electric field of the transmitted radiation passes through zero. The intensity, which is proportional to the square of the electric field, also goes through zero, making a very dark and sharp line on the wafer.

Figure 11B:
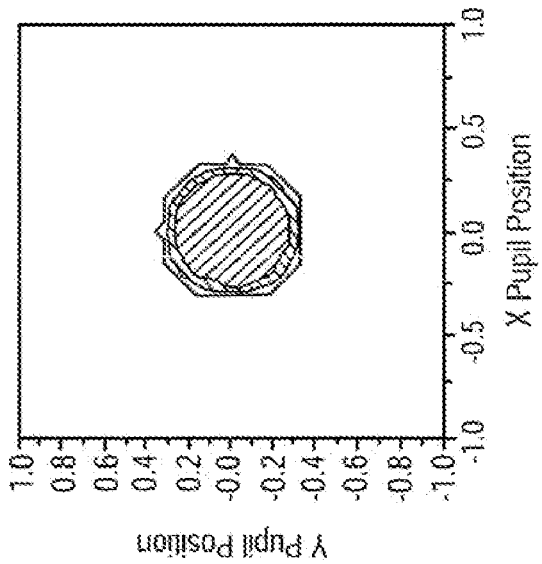
Figure 11C:
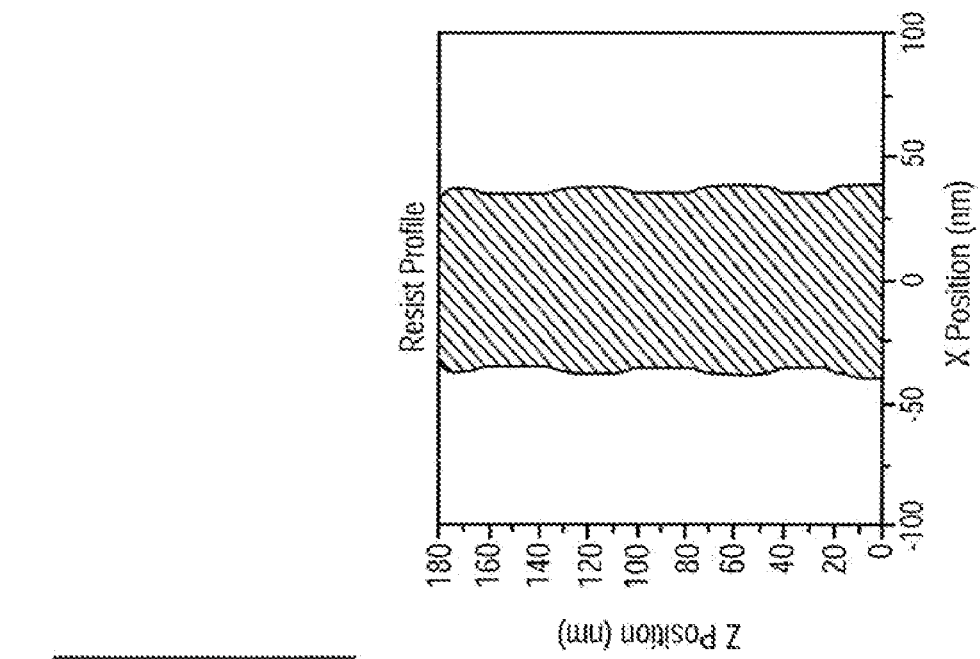
Figure 11A:
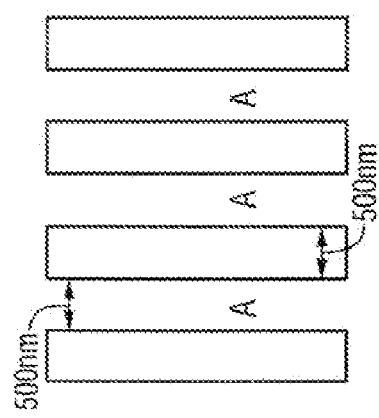
FIG. 11a shows a layout of a 75 nm isolated line (0° phase with a 40° phase edge) on an alternating phase shift mask.

FIGS. 11a-b show respectively a layout of isolated lines on an alternating phase shift mask and a cross section of an on-axis illumination intensity distribution in the pupil of the illumination system. FIG. 11c shows the profile of an isolated line that may be obtained when the alt-PSM of FIG. 11a is illuminated with the "small σ" illumination of FIG. 11b. In FIG. 11a, regions A are representative of a 180° phase region. Each stripe is 500 nm in width. The illumination configuration is a σ=0.3 conventional illumination. Calculations performed with a $NA_{PS}$=0.93 and 193 nm radiation, and an appropriate exposure dose, produce 75 nm lines on a 500 nm pitch in a positive resist, as shown in FIG. 11c.

Figures 12A, 12B:
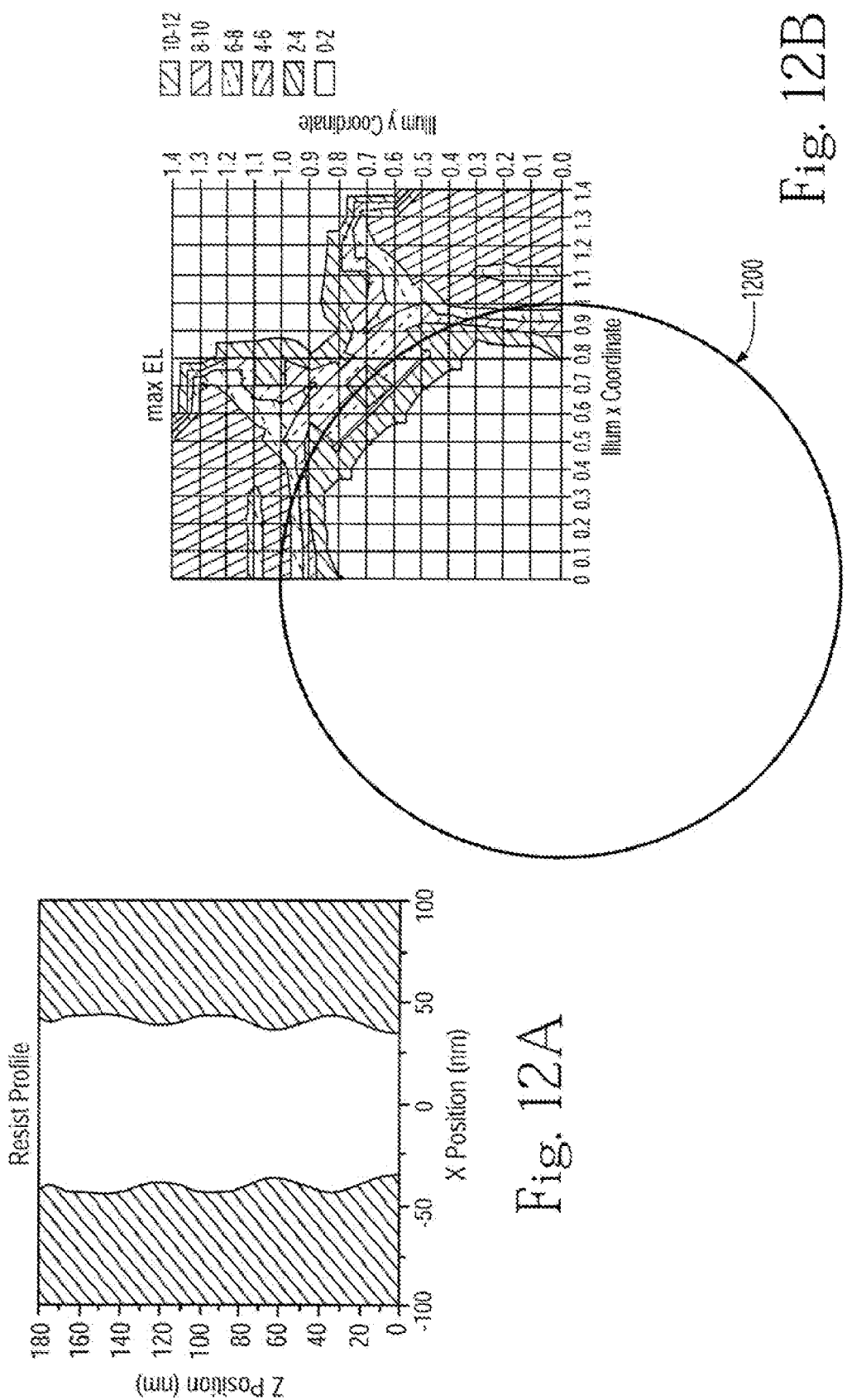
FIG. 12a shows a profile of a 75 isolated trench obtained with the alternating phase shift mask shown in FIG. 11a and dark field illumination.
FIG. 12b shows a simulated contour map of maximum exposure latitude as a function of source point location that indicates the regions in the illuminator that contribute to a higher value of exposure latitude.

In contrast to a direct σ<1 illumination approach, as shown in FIGS. 11a-c, dark field illumination, yields bright edges rather than dark edges and may be used to print isolated trenches from the same mask. FIG. 12a shows a profile of a 75 isolated trench (500 nm pitch) obtained with the alternating phase shift mask shown in FIG. 11a and dark field illumination. FIG. 12b shows simulation results displayed in a contour map and indicates the portion of the illuminator that prints trenches and their exposure latitude. Calculations indicate that an illumination mode having dark field poles located at 0°/180° and +/−90° relative to the horizontal axis and having a radial extent given by σ-inner =1.0 and σ-outer =1.4 provide satisfactory results in terms of exposure latitude. Note that the problem is symmetrical so that the result holds for trenches oriented both horizontally and vertically. These poles provide a dark field illumination corresponding to σ>1. Circle 1200 in FIG. 12b schematically shows the boundary between dark field illumination and direct illumination where σ=1. Zero diffraction orders of the diffraction patterns associated with source points located outside circle 1200 are not captured by the projection system numerical aperture.

Figure 13A:
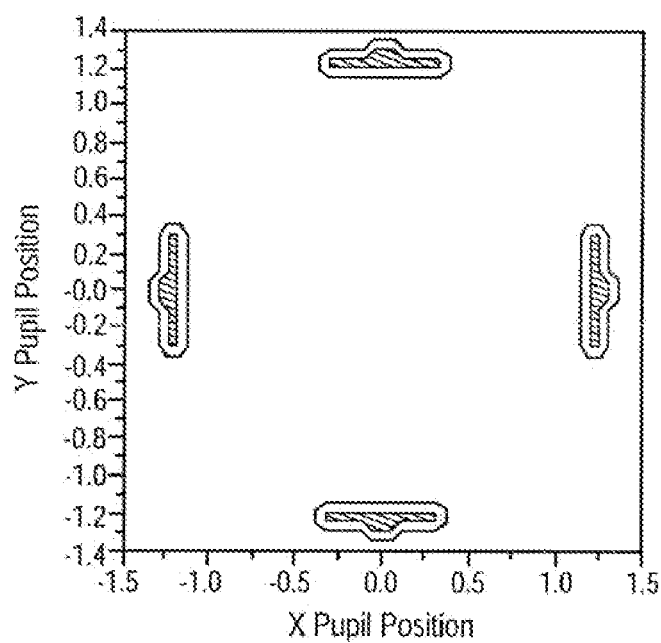
Figure 13B:
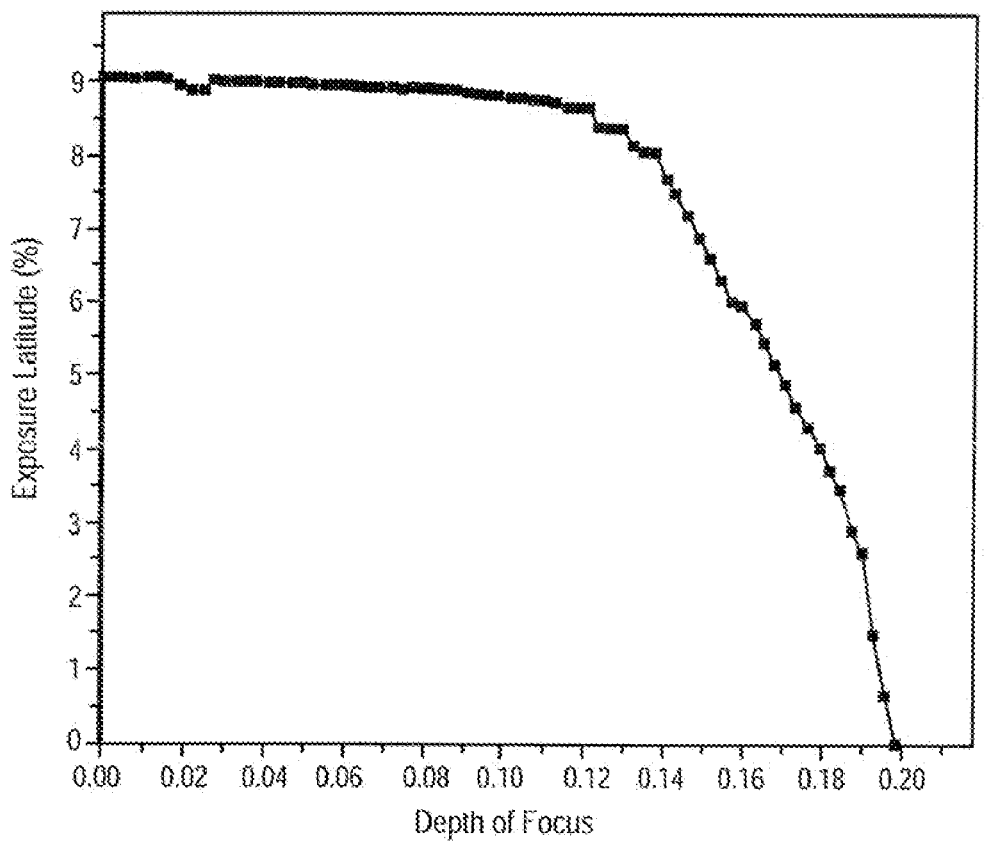

Depending on the part of the illumination pupil chosen to contribute to illumination, it is possible to print those trenches with sufficient exposure latitude (e.g. >5%). According to FIG. 12b, exposure latitude may be maximized with an illumination configuration that includes dark field poles having a 30° opening angle and located at 0°/180° and +/−90° relative to the horizontal axis. These poles can be constructed with σ-inner =1.2 and σ-outer =1.3. FIG. 13a represents a cross section of such an illumination configuration. FIG. 13b shows the variation of the exposure latitude as a function of depth of focus obtained with the illumination configuration of FIG. 13a. As can be seen in that latter figure, reasonable exposure latitude (9%, 0.2 μm of depth of focus) may be obtained with the dark field illumination approach.

Such approach may further be refined by using the principle of isofocal compensation, in which regions in the illumination pupil producing high CDs are balanced with regions producing small CDs. Isofocal compensation is based on the fact that errors in focus and dose can lead to two opposite effects, which can trigger a failure mechanism for the lithographic process. The first effect is characterized by a CD increase outside the range of acceptable CDs while the second effect is characterized by a CD decrease outside that range. In order to render the lithographic process substantially isofocal, optimization of the lithographic process may be performed by compensating one effect with another. Namely, regions of the illumination pupil shown in FIG. 12b that do not contribute to a greater value of exposure latitude (i.e., regions for which zero diffraction orders are captured by the projection system) may still be used to counterbalance dark field illumination regions in order to render the process substantially isofocal. More information regarding the principle of isofocal compensation may be gleaned from U.S. patent application Ser. No. 10/716,439, filed on Nov. 20, 2003, entitled "Lithographic Apparatus and Method for Optimizing an Illumination Source Using Isofocal Compensation."

Figure 14A:
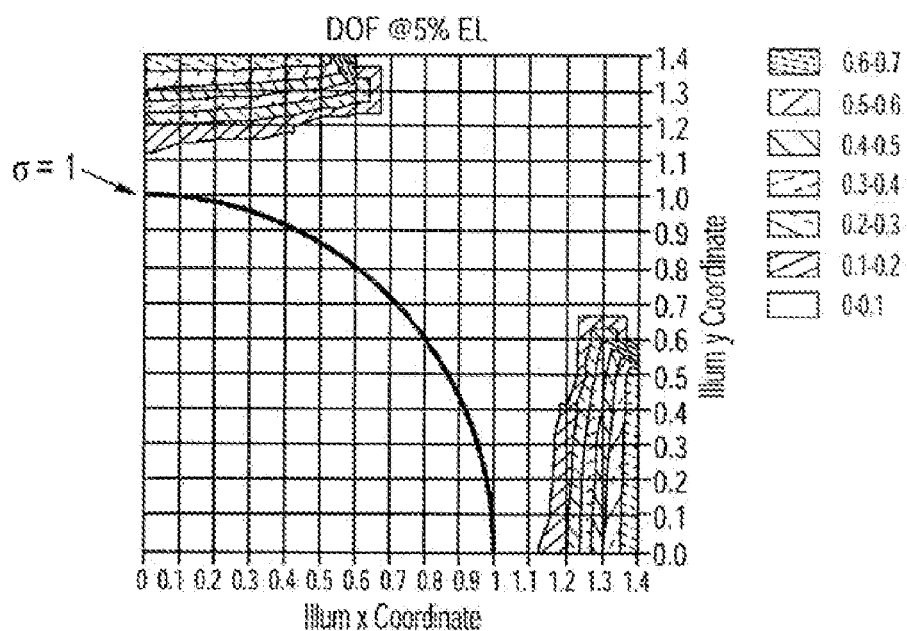
FIG. 14a shows a simulated contour map of depth of focus at 5% of exposure latitude as a function of source point location obtained with an alternating phase shift mask and dark field illumination for a dense pattern of 75 nm periodic trenches, in accordance with an embodiment of the invention.
Figure 14B:
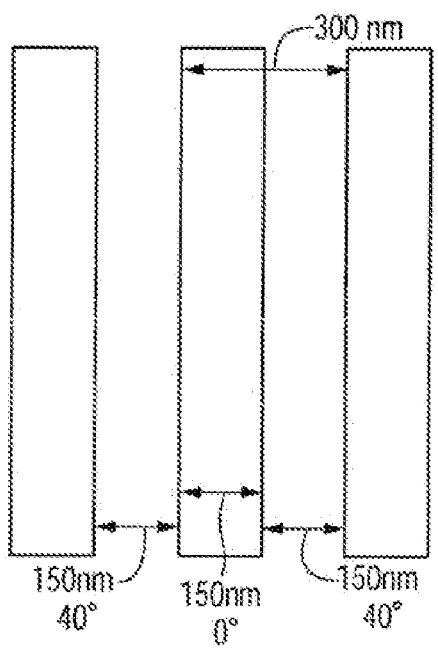
FIG. 14b shows a layout of 75 nm dense lines (0° phase with a 40° phase edge) on an alternating phase shift mask.

FIG. 14a shows DOF results obtained with an alternating phase shift mask and dark field illumination for a dense pattern of 75 nm periodic trenches, in accordance with an embodiment of the invention. As shown in FIG. 14b, the alt-PSM consists of alternating 0° and 40° phase regions that each have a 150 nm width. The trenches are printed at the intersection of the phase change regions. In order to define the trenches, a printing dose of about 240 mJ/cm$^2$ and $NA_{ps}$=0.93 was used in the simulations. Such process produces a maximum exposure latitude of about 13% and a depth of focus greater than about 0.5 μm. Separate simulations with a 10° and 180° phase edge indicate that these trenches can be printed with similar contrast, but with higher dose (3600 mJ/cm$^2$ and 28 mJ/cm$^2$ respectively). FIG. 14a shows a contour map for this pattern calculated in accordance with the embodiment of the invention of FIG. 3. The contour map indicates that dark field poles located at 0°/180°, and +/−90° relative to the horizontal axis of the mask pattern contribute to a high values of DOF at 5% exposure latitude for both horizontal and vertical trenches.

The results shown in FIGS. 11a-14b indicate that dark field illumination delivers an image with the reverse tone compared to an image obtained with the same mask and illuminated with radiation for which σ≦1. Therefore, dark field illumination in combination with a positive resist and an alternating phase shift mask may be used to print holes and trenches. Such approach avoids the use or development of appropriate negative-resist tone processes which may be complicated and costly.

Figure 15:
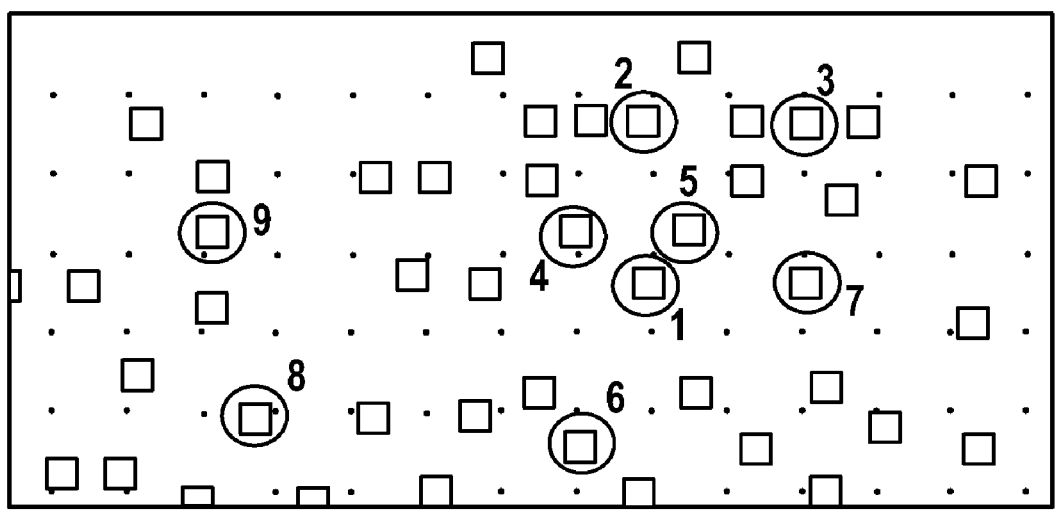
FIG. 15 is a schematic representation of a random or irregular hole pattern.

In a further embodiment of the invention, dark field illumination is used to print a complex, irregular or random arrangement of contact holes using high-transmission phase shift masks. An example of a random or irregular hole pattern, or hole pattern of low symmetry, is represented in FIG. 15. As can be seen in this Figure, contact holes are arranged horizontally and vertically with various pitches.

Figure 16A:
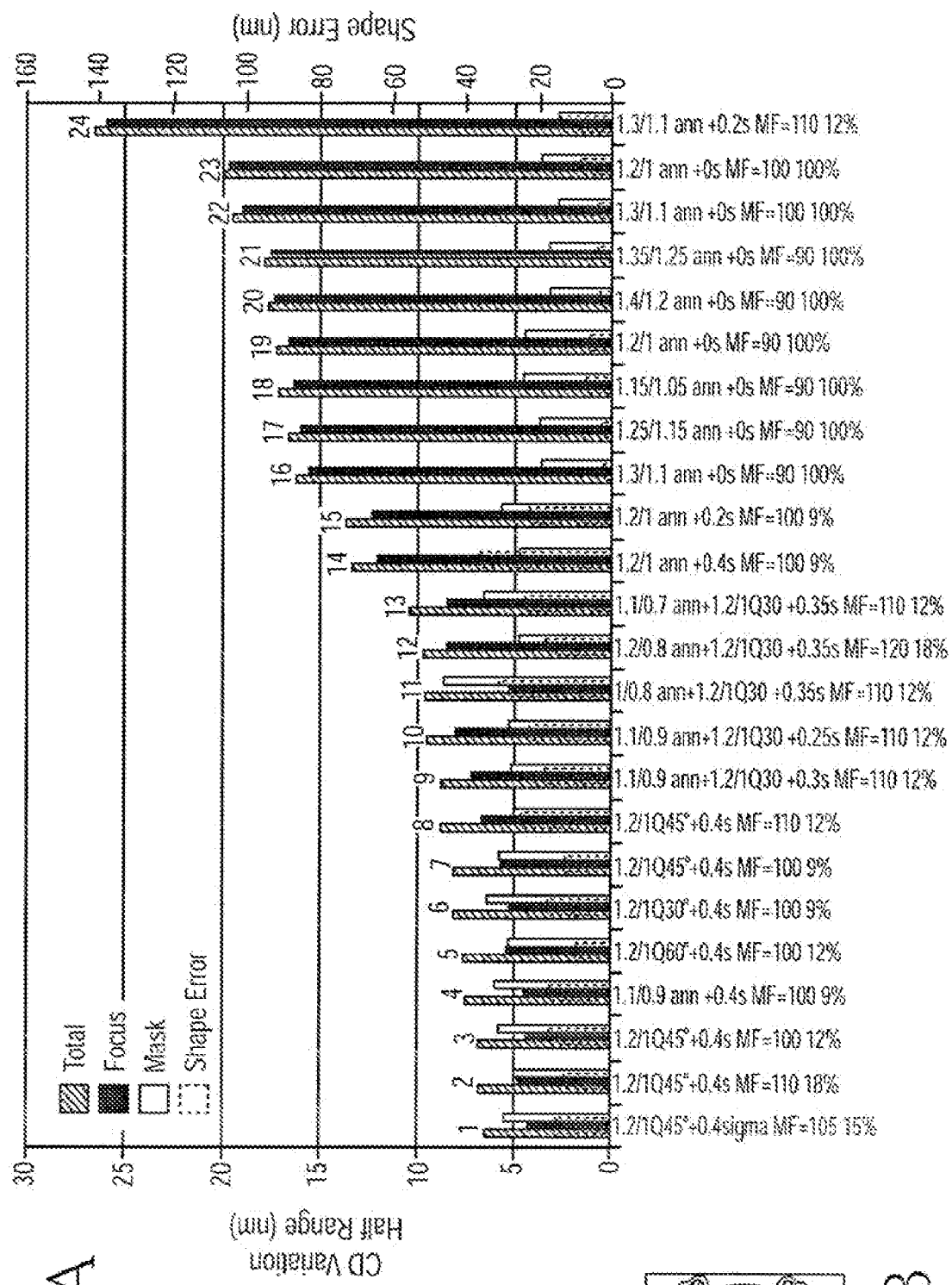
FIG. 16a represents CD variation at half range for the contact holes shown in FIG. 15, with twenty four illumination configurations.

FIG. 16a shows simulation results of CD variation at half range obtained for the random or irregular hole pattern of FIG. 15 with various illumination configurations. CD variation half range measurements substantially represent the critical dimension uniformity (CDU) of the holes. Results are given for the contact holes identified in FIG. 15 in terms of critical dimension uniformity, depth of focus, MEEF, and shape error. The results correspond to the average of the value for each hole Shape error corresponds to the absolute value of the difference between the critical dimension as measured in the vertical direction and the critical dimension as measured in the horizontal direction (i.e., abs(CDv-CDh)). This parameter is a representation of how "out of round" the holes are. Simulations are performed with a conventional commercial simulator.

The illumination configurations of FIG. 16a are described in the following manner. First, the characteristics in terms of size and location of the illumination pupil regions contributing to illumination are given. Each illumination configuration includes an off-axis component and, in some cases, a conventional on-axis component (identified by "s" and characterized by a maximum σ value, the minimum value being zero). The radial extent of the off-axis component is given first, i.e., the σ-outer and σ-inner values are given first. The tangential location of the off-axis component is given next: annular illumination is identified by "ann," four pole illumination with the poles arranged at +/−45° relative the X axis in FIG. 1 is identified by "Q" and followed by an indication of the opening angle of each of the four poles. For example, "Q45°" means that the opening angle of each pole of the four pole illumination is about 45°. Second, the size of the mask feature (MF) is given (nm). Third, the transmission (%) of the mask is provided. Illumination configurations 1-15 and 24 use an attenuated phase shift mask. Illumination configurations 16-23 use a chromeless phase lithography (CPL) mask (i.e., 100% transmission). For example, a "1.2/1.0 ann +0s MF100 100%" source shape includes an annular dark field illumination having a σ=1.0 inner radius and a σ=1.2 outer radius (without an on-axis component), and is used to print a 100 nm contact hole with a 100% transmitting CPL mask. In the remaining source shapes of FIG. 16a, the inner/outer radii of the annular or multipole dark field illumination, the mask transmission and the position of the dark field poles are changed.

Figure 16B:
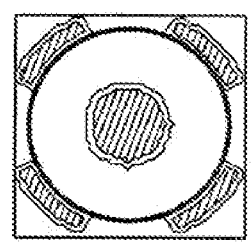
FIG. 16b shows a multipole illumination combining dark field off-axis illumination (dark field poles at 1.2/1 outer/inner radii arranged at +/−45° relative to the horizontal axis) with on-axis illumination (0.4 sigma central pole). This illumination configuration is used in combination with a 15% transmitting attenuated phase shift mask to print 105 nm contact holes (size on mask)

FIG. 16b represents a cross section of the first illumination pupil intensity distribution or "source shape" shown on the far left of FIG. 16a (i.e., 1.2/1Q45+0.4s). This source shape includes dark field poles arranged at 45° relative to the horizontal axis (i.e., quadrupole type off-axis illumination) and having a σ=1.0 inner radius and a σ=1.2 outer radius. This source shape also includes a σ=0.4 central pole. This source shape was used in combination with a 15% transmission attenuated phase shift mask to irradiate the random or irregular hole pattern with the mask biased to 105 nm. This condition gave the most favorable result, i.e., least CD variation, as shown in FIG. 16a.

As can be seen in FIG. 16a, CDU results are better for source shapes combining dark field illumination (e.g., poles or annular, such as 1.1/0.9+0.4s MF=100 9%) and direct on-axis illumination. CD variation lower than 7 nm can be obtained for several sources. Similarly, focus errors remain low for these source shapes. Furthermore, both pure (i.e., 1.2/1.0 Q45) and "mixed" (i.e., 1.1/0.9 annular) dark field off-axis illumination give good results when combined with on-axis illumination and an attenuated phase shift mask.

As can also be seen in FIG. 16b, dark field illumination in combination with 100% transmission CPL masks shows excellent random or irregular hole pattern performance, giving low MEEF and good hole shape fidelity. However, for these illumination scenarios, poor depth of focus may substantially degrade the overall CDU values.

Figure 17:
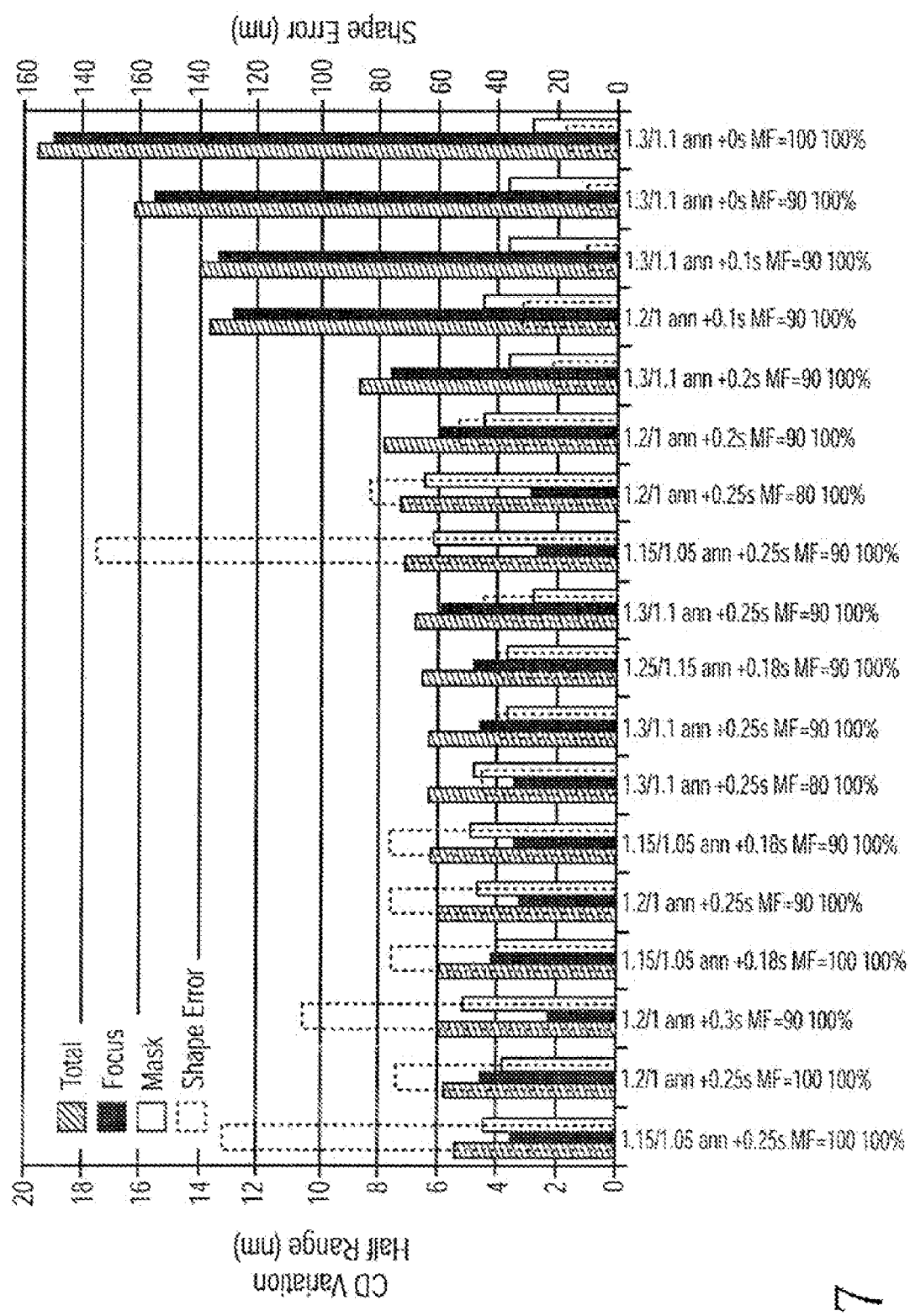
FIG. 17 represents CD variation at half range due to focus, mask and shape errors obtained with different illumination configurations.

In order to improve the depth of focus, off-axis dark field illumination and high transmission masks may be combined with on-axis illumination, in accordance with an embodiment of the invention shown in FIG. 17. Similarly to the embodiments of FIGS. 16a, simulations in FIG. 17 are performed for the contact holes of FIG. 15. FIG. 17 shows results in terms of CD variation half range, as well as the specific focus, mask and shape errors. The description of the illumination configurations of FIG. 17 is similar to that of FIG. 16a.

The last two illumination scenarios represented on the far right of FIG. 17 do not include on-axis illumination (i.e., 1.3/1.1 ann +0s MF=90 nm 100% transmission CPL mask and 1.3/1.1 ann +0s MF=100 nm 100% transmission CPL mask). As expected, these two source shapes provide poor CDU results. However, the addition of on-axis illumination reduces CDU, while maintaining mask and shape errors at acceptable levels (compare, for example, results for 1.3/1.1 ann +0s MF=90 nm 100% CPL with 1.3/1.1 ann +0.1s MF=90 nm 100% CPL). As can also be seen in FIG. 17, it is possible to obtain CDU lower than 6-7 nm with low MEEF and low shape error by appropriately balancing the simultaneous on-axis and dark field illumination condition.

Referring back to equation 1, the resolution limit of pattern printing is proportional to the radiation wavelength and inversely proportional to the numerical aperture of the projection system. On the other hand, the depth of focus, i.e., the distance along the optical axis over which the image of the pattern is adequately sharp, is proportional to the radiation wavelength and inversely proportional to the square of the numerical aperture. The depth of focus (DOF) may be expressed as follows:

$$DOF = +/- k_2 * \frac{\lambda}{NA^2} \quad (2)$$

where $k_2$ is an empirical constant.

A comparison of equations 1 and 2 indicates that, for a specific wavelength, any increase in the resolution of the pattern (i.e., lower CD) through the use of higher NA, decreases the depth of focus. However, the loss of depth of focus may have a considerable impact on device manufacturing yield. The focal plane of the lithographic apparatus may not coincide with the surface of the substrate anymore due to, for example, a large unevenness of the surface of the substrate or a large field curvature of the impinging radiation. Therefore, it is desirable to maintain an acceptable level of depth of focus to properly image the pattern.

In order to increase the depth of focus, it is proposed in an embodiment of the invention to use a focus variation during dark field exposure. The use of a focus variation, or focus drilling, changes the position of the focal plane of the lithographic apparatus relative to a reference plane that substantially coincides with or is substantially parallel to a surface of the substrate during exposure. The reference plane may correspond to the best focus plane. As a result, the effective depth of focus of the lithographic process may be increased significantly.

Figure 18:
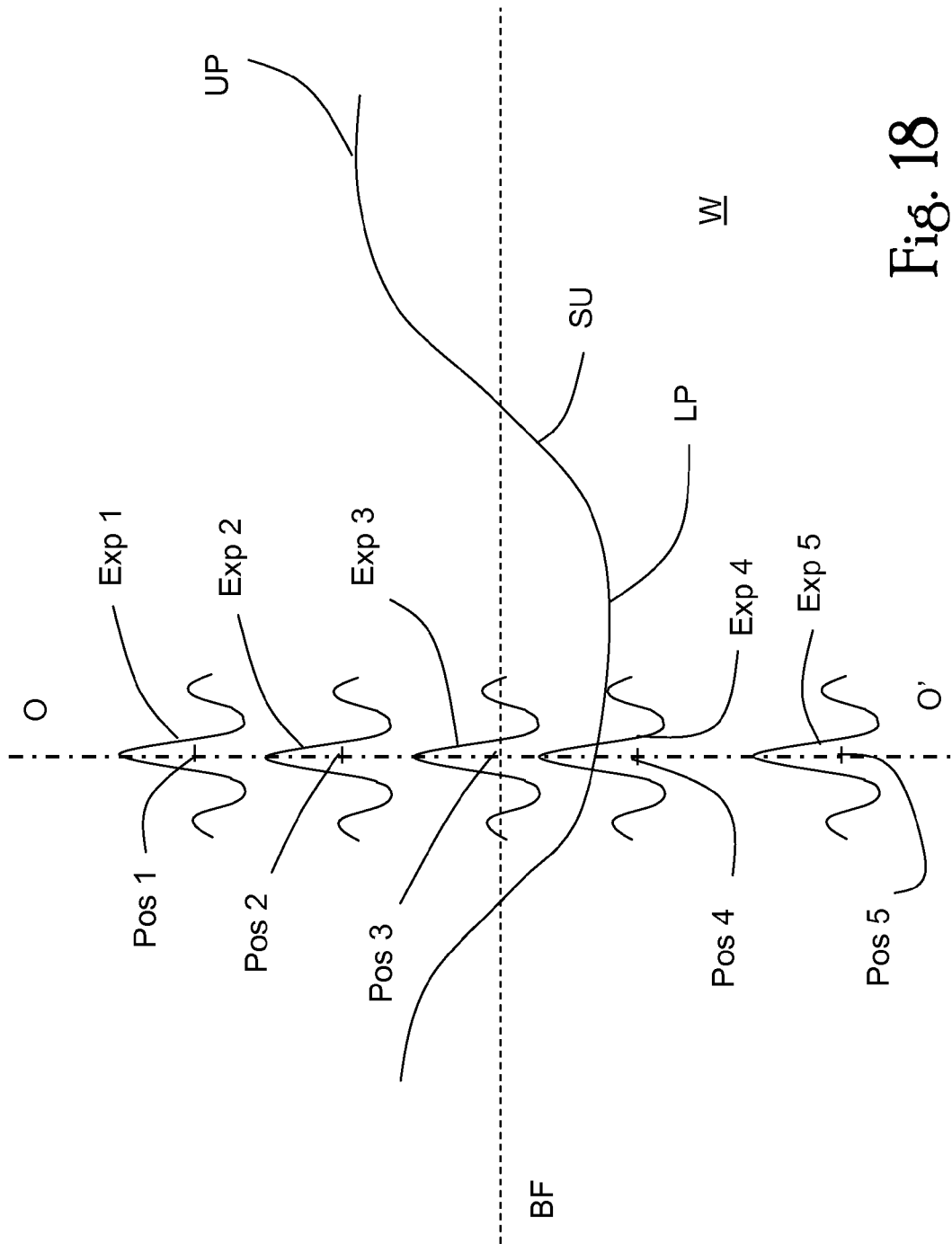
FIG. 18 schematically shows various positions of the focal plane of the lithographic apparatus during a focus variation.

FIG. 18 schematically shows the positions of the focal plane of a stepper apparatus during a focus variation, in accordance with an embodiment. The focus variation consists of a superposition of a plurality of exposures Exp 1, Exp 2, Exp 3, Exp 4 and Exp 5 at different corresponding positions Pos 1, Pos 2, Pos 3, Pos 4 and Pos 5 along the optical axis O-O' of the projection system. The distance between the first exposure Exp 1 and the fifth exposure Exp 5 is at least larger than the distance between the upper portion UP and lower portion LP of the surface SU of the substrate W. With a sufficient number of exposures, the focal plane and the surface of the substrate may substantially coincide with each other at the upper, lower and intermediate portions of the topography of the substrate surface. Thus, the image of the pattern can be formed accurately all over the surface of the substrate W regardless of its unevenness.

Although the focus variation shown in FIG. 18 consists of five consecutive discrete exposures, it will be appreciated that additional or fewer exposures may be performed. In addition, the focus variation of FIG. 18 may be performed on a scanning apparatus. As an alternative to multiple consecutive exposures, it will be appreciated that the focal plane in a scanner apparatus may be changed continuously during the focus variation. This may be done, for example, by tilting the substrate during the scan, as explained in more detail below.

In an embodiment, a focus variation may be generated during exposure by moving the substrate support along the optical axis of the projection system. In this configuration, the lithographic apparatus may include a control system, which may operatively be connected to the radiation system and the substrate table. The control system may be configured to synchronize the pulses emitted by the radiation system with the motion of the substrate table.

The displacement of the substrate support along the optical axis of the projection system may be continuous with a preselected time dependence (during exposure). In an implementation, the continuous displacement of the substrate support along the O-O' optical axis is a cyclic movement (e.g., a vibration), which may be sinusoidal or triangular. The distribution of distances between the focal plane and the reference plane during the entire exposure will depend upon the selected cyclic movement. The positioning of the substrate at a plurality of subsequent positions during exposure may be determined in accordance with a particular distribution, which may be modified in order to maximize the process window. It will be appreciated that the distribution may be used as a parameter to increase the process window. In an embodiment, the distribution may be uniform or Gaussian.

In an embodiment, a focus variation may be generated with a scanner type lithographic apparatus by scanning a substrate having a predetermined constant inclination relative to a plane perpendicular to the optical axis of the projection system. The focus variation may be determined geometrically with the tilt angle of the substrate and the slit width of the scanner. Alternatively or additionally, the focus variation may be obtained by varying the wavelength of the impinging radiation. In this embodiment, the pattern is imaged at different positions along the optical axis (i.e., one position for each wavelength) due to the chromatic aberrations of the projection system.

The contrast of the image obtained with a focus variation substantially corresponds to the average of the image contrasts of the various exposures Exp 1, Exp 2, Exp 3, Exp 4 and Exp 5. The focus variation and the distance between two adjacent exposures may be determined based on the image pattern to be printed, the numerical aperture of the projection system, and the radiation wavelength. However, it will be appreciated that the focus variation may also be determined based on the illumination configuration (e.g., the shape of a dark field component of the illumination configuration). In an embodiment, for example, a focus variation of about 0.5 μm may be used in conjunction with a conventional illumination profile having a sigma of about 1.4 that overfills the projection system, and thus contains dark field light. In another embodiment, a focus variation of less than about 1 μm may be used with more complex illuminations, which include on and off axis components or with a conventional illumination profile having a sigma smaller than about 1.4. Optimization of the focus variation and the illumination configuration (e.g., shape) may be done together using an iterative process. Likewise, the focus variation and its position relative to best focus may be done by computer simulation. In an embodiment of the invention, the focus variation may be centered about the best focus, which schematically corresponds to the reference plane BF in FIG. 18.

Figure 19:
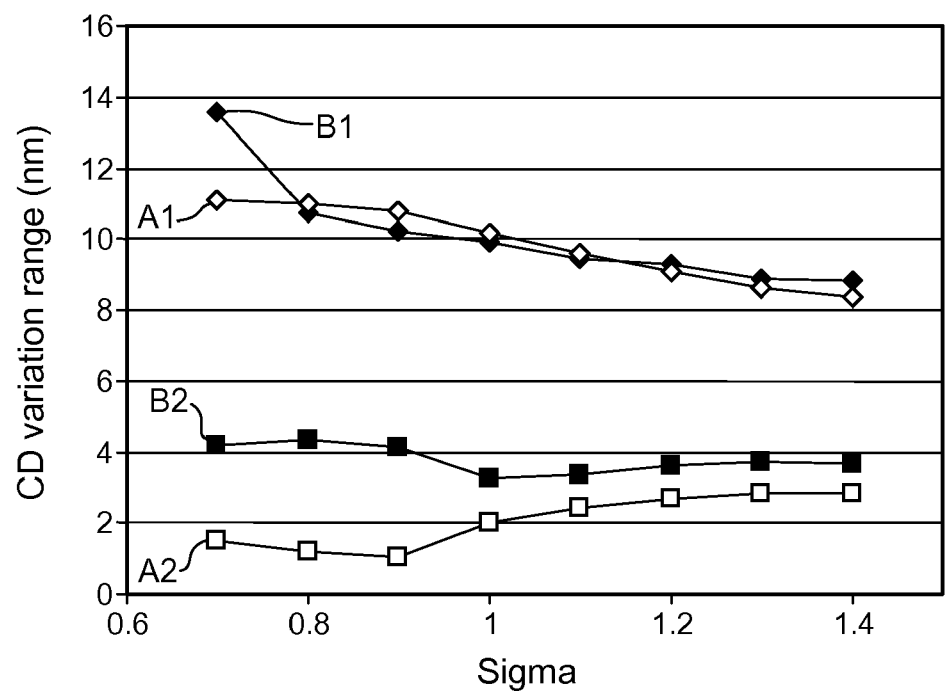
FIG. 19 shows the CD variation half range (nm) as a function of the pole size of a conventional illumination for two lithographic processes.

FIG. 19 shows the simulated CD variation half range (nm) as a function of pole size for a conventional illumination. In this calculation, a focus variation range during exposure of 0.5 μm (i.e. 0.5 μm focus drilling) is assumed. FIG. 19 shows that MEEF dominates the error budget when focus drilling is included. In FIG. 19, the CD variation is given for two different mask types: a 6% attenuated phase shift mask and a binary mask. For each mask, the CD variation is plotted due to both mask and focus errors. In this embodiment, a random or irregular pattern of 90 nm holes and a 0.9 numerical aperture are used. In FIG. 19, CD variations denoted as "A1" are obtained with the 6% attenuated phase shift mask, a 30 nm mask bias and mask induced errors; CD variations denoted as "B1" are obtained with the binary mask, a 20 nm mask bias and mask induced errors; CD variations denoted as "A2" are obtained with the 6% attenuated phase shift mask, a 30 nm mask bias and focus induced errors; and CD variations denoted as "B2" are obtained with the binary mask, a 20 nm mask bias and focus induced errors. As shown in FIG. 19, CD variations induced by mask errors are significantly greater than those induced by focus errors (see graphs A1 and B1). For example, for a 0.7 sigma illumination and a 6% attenuated phase shift mask, focus induced errors generate a CD variation of about 1.5 nm (see graph A2). By contrast, CD errors at the mask level for the same mask generates a CD variation of about 11 nm (see graph A1). However, as can be seen in FIG. 19, the effect of mask errors are reduced by increasing sigma, and the reduction continues when the pupil is overfilled (see graphs A1 and B1). Thus, the inclusion of dark field illumination by overfilling the pupil beyond sigma=1 in combination with a focus variation or focus drilling reduces the CD variations for both mask types. The benefit comes primarily from a reduction of the most critical sensitivity which is mask variation (MEEF is reduced).

Figure 20A:
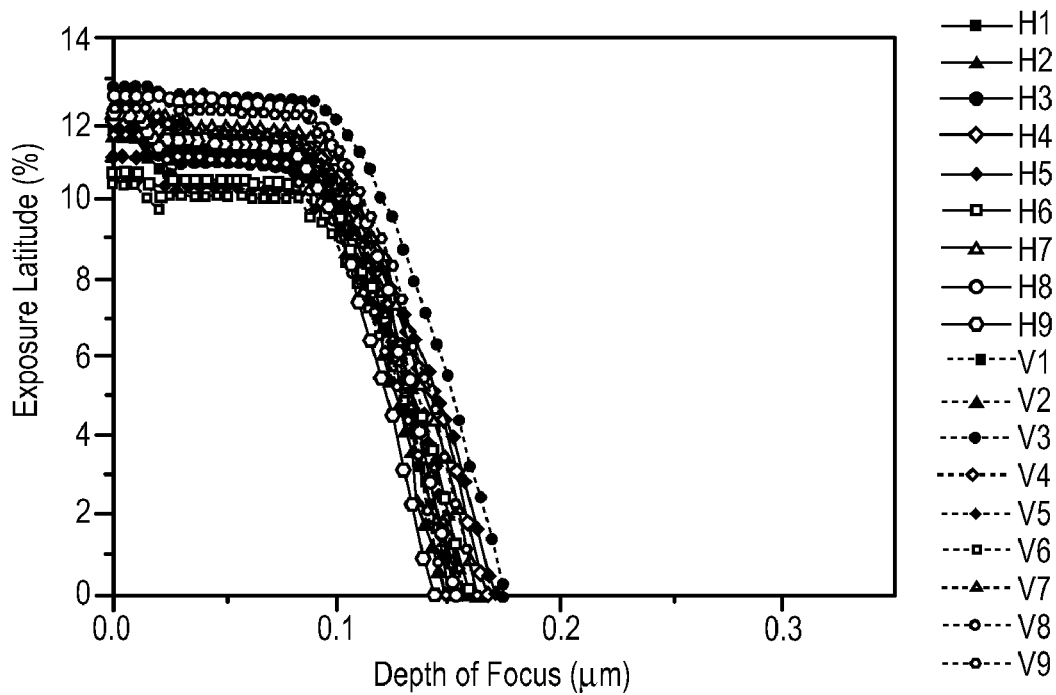
FIGS. 20a-c show simulated variations of exposure latitude (horizontal and vertical) as a function of depth of focus for 9 holes identified in the pattern of FIG. 15 and for three different lithographic processes.
Figure 21A:
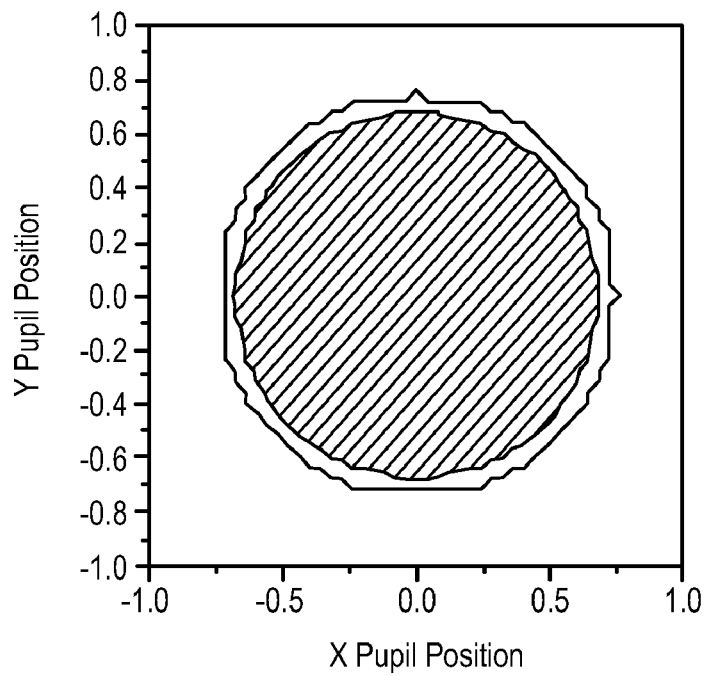
FIGS. 21a-c show three simulated on-axis conventional illuminations (sigma=0.7, 1 and 1.4) in accordance with embodiments of the invention.
Figure 20B:
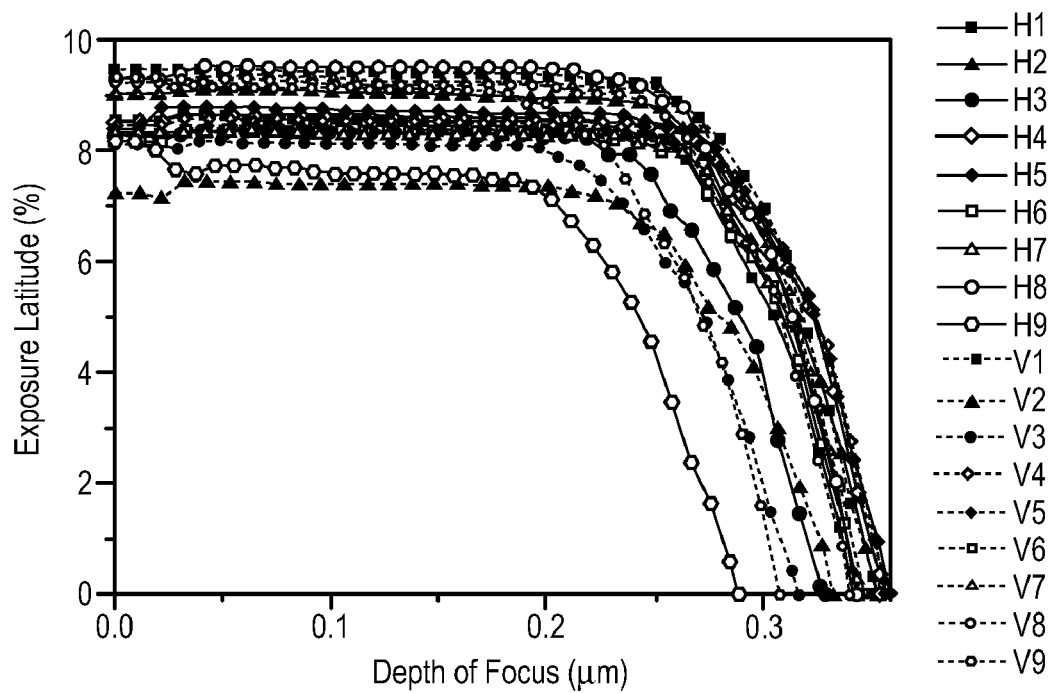
Figure 21B:
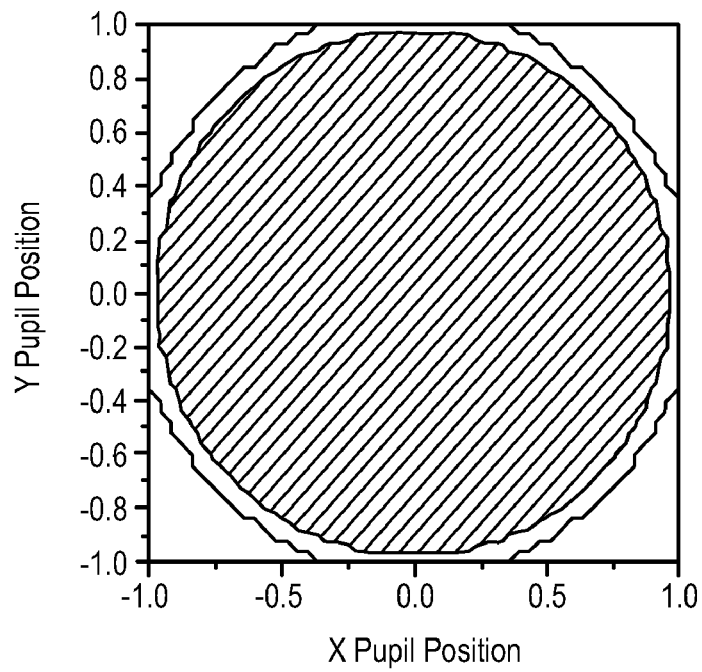
Figure 20C:
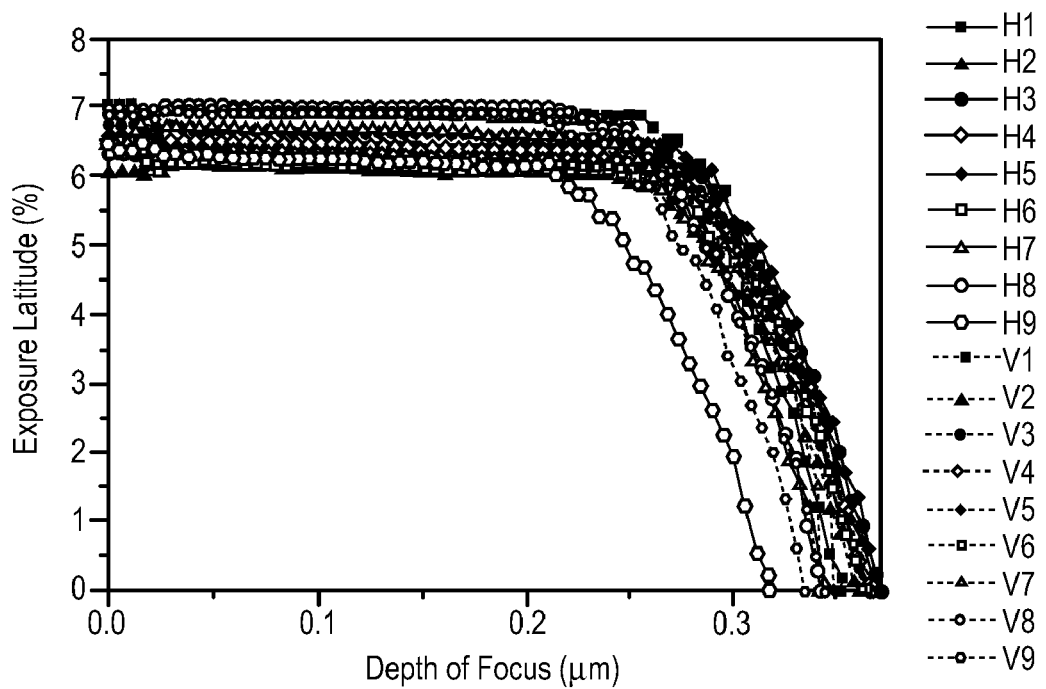
Figure 21C:
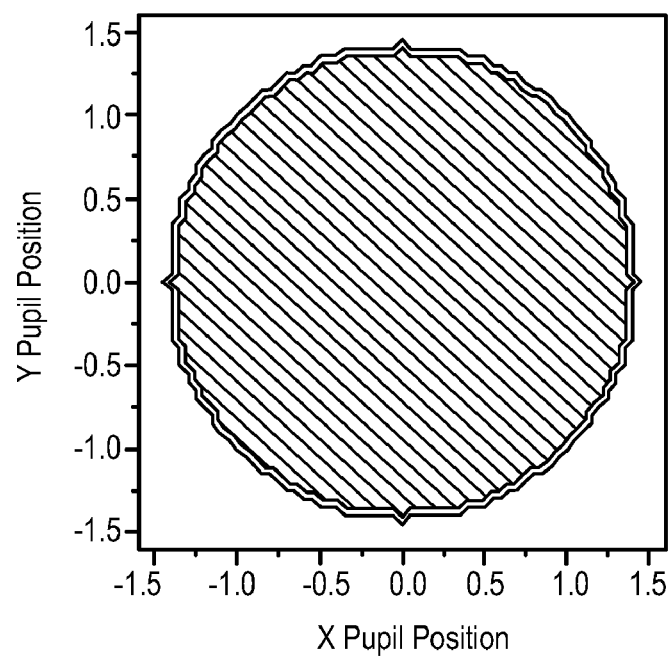

FIGS. 20a-c show the simulated variations of exposure latitude as a function of depth of focus for nine 90 nm holes (1-9) identified in FIG. 15 and for three different lithographic processes. The pattern of the 90 nm contact holes of FIG. 15 has a minimum pitch of about 171 nm (k1=0.4). In each scenario, the exposure latitude is provided both for the horizontal and the vertical portion of each hole. In the first lithographic process, the calculations are done with a 6% attenuated phase shift mask, a 5 nm mask bias, a 0.9 NA, an exposure dose of about 87.9 mJ/cm$^2$ and a conventional illumination shape having a sigma of about 0.7 (see FIG. 21$a$). No focus variation is used. In the second lithographic process, calculations are done with a binary mask, a 20 nm mask bias, a 0.9 NA, an exposure dose of about 56.7 mJ/cm$^2$ and a conventional illumination shape having a sigma of about 1 (see FIG. 21$b$). The third lithographic process combines a 6% attenuated phase shift mask, a 30 nm mask bias, a NA=0.9, an exposure dose of about 59.4 mJ/cm$^2$ and a conventional illumination shape having a sigma of about 1.4 (see FIG. 21$c$). A 0.5 μm focus variation is applied during substrate exposure for both the second and third lithographic processes. In this embodiment, the focus variation and the illumination shape are selected together to maximize the exposure latitude and the depth of focus of the lithographic process, and to minimize the MEEF.

Referring to FIG. 20$a$, this figure shows optimum results that may be obtained without focus drilling and with a conventional brightfield illumination. However, since focus drilling increases the depth of focus, conventional illumination profiles having a larger sigma may be used to decrease MEEF. This implementation corresponds to the second lithographic process. As can be seen in FIG. 20$b$, the use of focus drilling and an illumination shape having a sigma of about 1 substantially increases the depth of focus while not degrading MEEF.

These results can further be improved by overfilling the pupil into the darkfield regime. As can be seen in FIG. 20$c$, the combination of a dark field illumination and a focus variation provides excellent results both in terms of exposure latitude and depth of focus, regardless of the hole position and its orientation (vertical/horizontal) examined. This combination also significantly reduces the MEEF as indicated in Table A, which shows simulated MEEF values for the vertical and horizontal portions of each hole for the first, second and third lithographic processes.

TABLE A

| Hole No. | MEEF (1$^{st}$ lithographic process) | MEEF (2$^{nd}$ lithographic process) | MEEF (3$^{rd}$ lithographic process) |
| --- | --- | --- | --- |
| 1H | 7.56 | 5.23 | 3.93 |
| 2H | 6.49 | 4.65 | 4.24 |
| 3H | 7.16 | 4.74 | 4.00 |
| 4H | 6.48 | 3.77 | 4.06 |
| 5H | 7.61 | 4.37 | 4.12 |
| 6H | 8.85 | 5.05 | 3.79 |
| 7H | 7.24 | 4.18 | 3.92 |
| 8H | 8.54 | 4.65 | 3.64 |
| 9H | 7.91 | 4.75 | 3.93 |
| 1V | 6.96 | 4.28 | 4.03 |
| 2V | 6.16 | 4.44 | 3.80 |
| 3V | 8.25 | 4.46 | 3.66 |
| 4V | 7.49 | 4.73 | 3.85 |
| 5V | 7.66 | 4.87 | 4.42 |
| 6V | 8.35 | 4.44 | 3.63 |
| 7V | 5.82 | 3.36 | 3.84 |
| 8V | 6.00 | 3.51 | 4.10 |
| 9V | 6.81 | 4.62 | 4.20 |

FIG. 22 shows the simulated pattern of FIG. 15 obtained with the combination of the illumination of FIG. 20$c$ and a 0.5 μm focus variation. In FIG. 22, the mask pattern of FIG. 15 (square holes) is superposed with the simulated pattern (identified by "S"). As can be seen in this figure, no sidelobes appear during pattern printing and the hole shape and uniformity are excellent.

In an embodiment, the illumination shape may be annular or a multipole shape with all or a portion of the annular illumination being dark field (i.e., radius σ>1.0) and optionally includes on-axis or off-axis illumination with a radius σ<1.0 (e.g., a bullseye configuration with annular illumination being all or part dark field and an on-axis pole).

Although specific examples of dark field illumination configurations are described in this text, it should be understood that alternative dark field illumination configurations may be used in other embodiments of the invention. For example, simulations have shown that a dark field illumination component with a σ-outer value up to 1.8 may be used in some circumstances. Thus, the dark field illumination configurations are not limited to the particular multipole illuminations or annular illuminations that are described or depicted in this text or drawings.

It will be appreciated that the different acts involved in configuring the optical transfer of the mask pattern onto the substrate may be executed according to machine executable instructions. These machine executable instructions may be embedded in a data storage medium, e.g., of a control unit of the lithographic apparatus. The control unit may include a processor that is configured to control the adjusting device AM and to modify the cross-sectional intensity distribution in the beam exiting the illumination system IL.

In an embodiment of the invention, the machine executable instructions may be embedded in a computer product which can be used in conjunction with a simulation software, such as Prolith™, Solid-C™, Lithocruiser™ or the like. That is, the computer product can be configured to generate and input illumination files into the simulation software and instruct the simulation software to calculate an image of the desired pattern using, for example, an aerial or a full resist simulation. The computer product may then be configured to output the calculated image and to evaluate this image versus one or more criteria to judge whether the image has appropriate optical qualities to successfully print the desired mask pattern on the substrate. The image can be analyzed, for example, through a focus range to provide estimates of the exposure latitude and depth of focus. The computer product may also be configured to create the contour maps for the different lithographic responses as a function of source point location. Alternatively or additionally, the machine executable instructions may be part of a lithographic simulation software that provides the capability to calculate an image of the pattern with dark field illumination.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm).

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system."

The illumination system may also encompass various types of optical components, including refractive, reflective, and catadioptric optical components for directing, shaping, or controlling the beam of radiation, and such components may be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g., water, so as to fill a space between a final element of the projection system and the substrate. Immersion liquids may also be applied to other spaces in the lithographic apparatus, for example, between the mask and a first element of the projection system. Immersion techniques are well known in the art for increasing the numerical aperture of projection systems.

The methods described herein may be implemented as software, hardware or a combination. In an embodiment, there is provided a computer program comprising a program code that, when executed on a computer system, instructs the computer system to perform any or all of the methods described herein.

While specific embodiments of the invention have been described above, it will be appreciated that the invention may be practiced otherwise than as described. The description is not intended to limit the invention.

What is claimed is:

1. A method of transferring a pattern image onto a substrate with a lithographic apparatus, the lithographic apparatus including an illumination system having a pupil plane and configured to provide an illumination configuration and a projection system having a numerical aperture, the method comprising:
    illuminating a patterning device pattern with an illumination configuration that includes a dark field component; and
    projecting an image of the illuminated pattern onto the substrate at a plurality of positions spaced apart from a reference plane that substantially coincides with or is substantially parallel to a surface of the substrate; and
    determining the plurality of positions based on a shape of the illumination configuration.

2. The method of claim 1, wherein the reference plane corresponds to an estimated best focus plane and the plurality of positions defines a range centered about the reference plane.

3. The method of claim 1, wherein the plurality of positions defines a range of less than about 1 μm.

4. The method of claim 1, wherein the determining comprises determining the plurality of positions based on a shape of the dark field component.

5. The method of claim 1, wherein the projecting includes moving the substrate along an optical axis of the projection system.

6. The method of claim 1, wherein the substrate is moved in accordance with a predetermined distribution of said plurality of positions.

7. The method of claim 1, wherein the projecting includes inclining the substrate so as to position the reference plane at an angle relative to a plane substantially perpendicular to an optical axis of the projection system and moving the substrate substantially parallel to the plane.

8. The method of claim 1, wherein the illumination configuration includes an on-axis component.

9. The method of claim 8, wherein the on-axis component is an on-axis pole having in the pupil plane a radius that is a fraction of a radius of the numerical aperture, wherein the fraction is greater than 1.

10. The method of claim 1, wherein the dark field component includes a multipole illumination configuration.

11. A lithographic apparatus comprising:
    an illumination system having a pupil plane and configured to illuminate a patterning device pattern with an illumination configuration that includes a dark field component and a bright field component;
    a substrate table configured to hold a substrate; and
    a projection system configured to project an image of the illuminated pattern onto the substrate,
    wherein the lithographic apparatus is configured to project the image of the illuminated pattern at a plurality of positions spaced apart from a reference plane that substantially coincides with or is substantially parallel to a surface of the substrate, the plurality of positions being determined based on a shape of the illumination configuration.

12. The apparatus of claim 11, wherein the reference plane corresponds to an estimated best focus plane and the plurality of positions define a range centered about the reference plane.

13. The apparatus of claim 11, wherein the plurality of positions define a range of less than about 1 µm.

14. The apparatus of claim 11, further comprising a controller that operatively synchronizes a motion of the substrate table with the projection of the image of the illuminated pattern at a plurality of positions.

15. The apparatus of claim 14, wherein the controller is configured to position the substrate at an angle relative to a plane substantially perpendicular to an optical axis of the projection system.

16. The apparatus of claim 14, wherein the controller is configured to move the substrate along an optical axis of the projection system during projection of the image of the illuminated pattern.

17. The apparatus of claim 16, wherein the controller is configured to move the substrate in accordance with a predetermined distribution of the plurality of positions.

18. The apparatus of claim 17, wherein the on-axis component is an on-axis pole having in the pupil plane a radius that is a fraction of a radius of the numerical aperture, wherein the fraction is greater than 1.

19. The apparatus of claim 11, wherein the illumination configuration includes an on-axis component.

20. The apparatus of claim 11, wherein the dark field component includes a multipole illumination configuration.

21. A machine readable medium encoded with machine executable instructions, said instructions being executable by a machine to perform a method of transferring a pattern image onto a substrate with a lithographic apparatus, the lithographic apparatus including an illumination system having a pupil plane and configured to provide an illumination configuration and a projection system having a numerical aperture, the method comprising:

illuminating a patterning device pattern with an illumination configuration that includes a dark field component;

projecting an image of the illuminated pattern onto the substrate at a plurality of positions spaced apart from a reference plane that substantially coincides with or is substantially parallel to a surface of the substrate; and determining the plurality of positions based on a shape of the illumination configuration.

22. The machine readable medium of claim 21, wherein the projecting includes moving the substrate along an optical axis of the projection system.

23. The machine readable medium of claim 22, wherein the substrate is moved in accordance with a predetermined distribution of said plurality of positions.

24. The machine readable medium of claim 21, wherein the projecting includes inclining the substrate so as to position the reference plane at an angle relative to a plane substantially perpendicular to an optical axis of the projection system and moving the substrate substantially parallel to the plane.

* * * * *